(12) United States Patent
Do et al.

(10) Patent No.: US 11,189,692 B2
(45) Date of Patent: Nov. 30, 2021

(54) VFET STANDARD CELL ARCHITECTURE WITH IMPROVED CONTACT AND SUPER VIA

(71) Applicant: SAMSUNG ELECTRONICS CO., LTD., Suwon-si (KR)

(72) Inventors: Jung Ho Do, Hwaseong-si (KR); Rwik Sengupta, Austin, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 40 days.

(21) Appl. No.: 16/711,582

(22) Filed: Dec. 12, 2019

(65) Prior Publication Data

US 2020/0295134 A1    Sep. 17, 2020

Related U.S. Application Data

(60) Provisional application No. 62/819,056, filed on Mar. 15, 2019.

(51) Int. Cl.
| | | |
|---|---|---|
| H01L 27/24 | (2006.01) | |
| H01L 29/06 | (2006.01) | |
| H01L 29/08 | (2006.01) | |
| H01L 29/78 | (2006.01) | |

(52) U.S. Cl.
CPC ...... *H01L 29/0696* (2013.01); *H01L 29/0847* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 9,064,730 B2 * | 6/2015 | Ellis | H01L 27/10888 |
| 9,117,528 B2 | 8/2015 | Masuoka et al. | |
| 9,177,924 B2 | 11/2015 | Colinge et al. | |
| 9,680,473 B1 | 6/2017 | Anderson et al. | |
| 9,691,471 B2 | 6/2017 | Liaw | |
| 9,859,898 B1 | 1/2018 | Anderson et al. | |
| 10,037,397 B2 | 7/2018 | Moroz et al. | |
| 10,074,570 B2 | 9/2018 | Anderson et al. | |
| 10,109,637 B1 | 10/2018 | Zang et al. | |
| 10,177,087 B2 | 1/2019 | Lau et al. | |
| 2011/0233512 A1 * | 9/2011 | Yang | B82Y 10/00 257/9 |
| 2017/0011929 A1 | 1/2017 | Jun et al. | |
| 2017/0365712 A1 * | 12/2017 | Bu | H01L 29/66522 |
| 2020/0006552 A1 * | 1/2020 | Anderson | H01L 27/1104 |

FOREIGN PATENT DOCUMENTS

KR    10-2015-0073262 A    7/2015

* cited by examiner

*Primary Examiner* — Ali Naraghi
(74) *Attorney, Agent, or Firm* — Sughrue Mion, PLLC

(57) ABSTRACT

A cell architecture for vertical field-effect transistors (VFETs) is provided. The cell architecture includes: top source/drain (S/D) contact structure having a square shape in a plan view; and horizontal metal patterns formed on the top S/D contact structures and extended in an X-direction to be connected to a vertical pattern through with an output signal of a logic circuit formed by the VFETs. The cell architecture further includes a gate contact structure formed on a gate connection pattern connecting gates of the VFETs, wherein a super via is formed on the gate contact structure to receive an input signal of the logic circuit.

10 Claims, 27 Drawing Sheets

VFET STANDARD CELL ARCHITECTURE WITH IMPROVED CONTACT AND SUPER VIA

CROSS-REFERENCE TO THE RELATED APPLICATION

This application claims priority from U.S. Provisional Application No. 62/819,056 filed on Mar. 15, 2019 in the U.S. Patent and Trademark Office, the disclosure of which is incorporated herein in its entirety by reference.

BACKGROUND

1. Field

Apparatuses consistent with exemplary embodiments of the inventive concept relate to semiconductor cell architectures for vertical field effect transistors (VFETs).

2. Description of the Related Art

FIGS. 1A-1D illustrate portions of a related art semiconductor cell architecture (hereafter referred to as "cell architecture") viewed in different directions. This cell architecture is provided for a plurality of VFETs to be on a semiconductor substrate SUB to constitute a two-fin inverter using two fin structures F1 and F2 extended in a Y-direction as shown in FIG. 1A. FIG. 1E illustrates a schematic of the inverter implemented by the cell architecture shown in FIGS. 1A-1D. Specifically, FIG. 1A shows a top plan view of the cell architecture. FIGS. 1B-1D show cross-section views of the cell architecture shown in FIG. 1A taken along lines A-A', B-B' and C-C', respectively. It is noted that, for description brevity purposes, some elements shown in one drawing may not be shown in another drawing in FIGS. 1A-1D.

The inverter of the cell architecture of FIG. 1A-1D is formed by two p-channel metal-oxide semiconductor (PMOS) VFETs P1 and P2 arranged in an X-direction, and two n-channel MOS (NMOS) VFETs N1 and N2 also arranged in the X-direction, that is, a cell width direction, and respectively disposed below the two PMOS VFETs in the Y-direction, that is, a cell height direction. These four VFETs are formed on or around respective fins F11, F12, F21 and F22 formed on the two fin structures F1 and F2 extended in a Y-direction and arranged side-by-side in the X-direction. Hereafter, the PMOS VFET and the NMOS VFET are referred to as PMOS and NMOS, respectively, for description brevity purposes.

Specifically, with respect to the PMOS P1 shown in FIG. 1B, a bottom source/drain region (S/D) RX1 is provided at a lower part of the fin F11, and a top S/D region T2 is formed on or around an upper part of the fin F12. Further, a gate G1 is formed between the top S/D region T1 and the bottom S/D region RX1 in the form of wrapping around a middle part of the fin F11. With respect to the NMOS N1 shown in FIG. 1B, a bottom S/D region RX2 is provided at a lower part of the fin F12, and a top S/D region T2 is formed on or around an upper part of the fin F12. Further, a gate G2 is formed between the top S/D region T2 and the bottom S/D region RX2 in the form of wrapping around a middle part of the fin F12. With respect to the PMOS P2 shown in FIG. 1C, the bottom S/D region RX1 is provided at a lower part of the fin F21, and a top S/D T3 is formed on or around an upper part of the fin F21. Further, a gate G3 is formed between the top S/D region T3 and the bottom S/D region RX1 in the form of wrapping around a middle part of the fin F21. With respect to the NMOS N2 shown in FIG. 1C, the bottom S/D region RX2 is provided at a lower part of the fin F22, and a top S/D region T4 is formed to cover and wrap an upper part of the fin F22. Further, a gate G4 is formed between the top S/D region T4 and the bottom S/D region RX2 in the form of wrapping around a middle part of the fin 22.

Referring to FIGS. 1A and 1B, a gate connection pattern PB is formed between the four VFETs to connect gates G1 to G4 of the four VFETs. On the gate connection pattern PB is formed a gate contact structure CB on which a metal pattern M13 is formed. The metal pattern M13 may be connected to the gate contact structure CB through a via V05 formed between the metal pattern M13 and the gate contact structure CB. An input signal $V_{in}$ of the inverter is input to this cell architecture through the metal M13 pattern.

Referring to FIG. 1B, the top S/D region T1 of the PMOS P1 and the top S/D region T2 of the NMOS N1 are connected to a top S/D contact structure CA1 and a top S/D contact structure CA2, respectively, formed thereon. Referring to FIGS. 1B-1D, the top S/D region T3 of the PMOS P2 is connected to the top S/D contact structure CA1 to which the top S/D region T1 of the PMOS P1 is connected. Thus, the top S/D region T1 of the PMOS P1 and the top S/D region T3 of the PMOS P2 are connected to the same S/D contact structure CA1 which is extended in the X-direction in a bar shape in a plan view of the cell architecture. Similarly, the top S/D region T4 of the NMOS N2 is connected to the top S/D contact structure CA2 to which the top S/D region T2 of the NMOS N1 is connected. Thus, the top S/D region T2 of the NMOS N1 and the top S/D region T4 of the NMOS N2 are connected to the same S/D contact structure CA2 which is extended in the X-direction in the bar shape in the plan view of the cell architecture. These two respective common S/D contact structures CA1 and CA2 are connected to another metal pattern M14 through vias V06 and V07, respectively. An output signal $V_{out}$ of the two-fin inverter is transmitted out through this metal pattern M14.

Further, referring to FIGS. 1A-1C, the bottom S/D regions RX1 and RX2 of the VFETs are respectively connected to a power rail Vdd and a ground rail Vss through power contact structure CR1 to CR4 and respective vias V01 to V04.

In FIGS. 1B to 1D, the top S/D regions, the bottom S/D regions, the top S/D contact structures, power contact structures, vias and metal patterns may be insulated from one another through interlayer structures IL such as dielectric layers, and the bottom S/D regions RX1 and RX2 are surrounded by or isolated from each other by shallow trench isolation regions STI on the semiconductor substrate SUB. Herebelow, descriptions about the interlayer structures IL and the shallow trench isolation regions STI will be omitted in describing the respective cell architectures for brevity purposes.

The above cell structure can also be used to constitute a more complicated logic circuit such as a two-fin And-Or-Inverter (AOI)22 circuit by including more VFETs and forming corresponding gate connection patterns, gate contact structure, top S/D contact structures and metal patterns for internal routings and power connections.

FIGS. 2A-2C illustrate portions of a related art cell architecture provided for the AOI22 circuit. A schematic equivalent to the AOI22 circuit is shown in FIG. 2D.

Referring FIG. 2A, the cell architecture provides a plurality of equally-pitched fin structures F1 to F8 along which eight PMOSs and eight NMOSs, twice as many as the number of VFETs in the schematic of FIG. 2D, can be formed. FIG. 2A also shows bottom S/D regions RX1, RX2 and RX3, a gate connection pattern PB, gate contact structures CB1 to CB4, top S/D contact structures CA1 and CA2, power contact structures CR1 to CR3, vias V01 to V06, metal patterns M13 to M17 for connecting input signals $V_{in}$ and an output signal $V_{out}$ of the AOI22 circuit, and metal patterns M11 and M12 for connections with a power rail Vdd and a ground rail Vss. The gate contact structures CB1 to CB4 connect corresponding gates to corresponding vertical metal patterns M13 to M16 through corresponding vias V01 to V04. At least one of the vertical metal patterns M13 to M16 is further connected to at least one upper-most metal pattern M21 through a via V11 as shown in FIG. 2B which is a cross-section view D-D' of the cell architecture of FIG. 2A. To the metal pattern M21, one of gate input signals $V_{in}$ of the AOI22 circuit is input.

FIG. 2A also shows a couple of top S/D contact structures CA1 and CA2 connected to a metal pattern M17 for internal routing. In particular, as shown in FIG. 2A, the top S/D contact structures CA1 and CA2 take a bar shape extended in the X-direction, in the plan view of the cell architecture, to connect top S/D regions of two or more VFETs to the metal pattern M17. For example, the bar-shaped top S/D contact structure CA2 is connected to the metal pattern M17 through a via V06, which is further connected to a metal pattern M22 through a via V12 as shown in FIG. 2C, which is a cross-section view E-E' of the cell architecture of FIG. 2A.

As noted above, the related art cell architectures for logic circuits constituted by VFETs use top S/D contact structures having a bar shape extended in the X-direction for internal routing, and thus, it is difficult to reduce a cell height and/or a cell width of the cell architectures. Further, considering widths of gate contact structures CB, top S/D contact structures and power contact structures, and spaces between these contact structures as required in the standard cell architecture, the related art cell architectures have limits in reducing the overall size thereof. For example, if a top S/D contact structure is to be reduced, it is required to secure a sufficient space with surrounding top S/D contact structures, which renders the cell architecture more complicated. In addition, since a sufficient area for forming a via on a top S/D contact structure to connect the top S/D contact structure to a metal pattern, it is difficult to reduce an area of the top S/D contact structure which should overlap the via. Thus, in order to reduce the cell height and the cell width of the cell architectures for VFET logic circuits without sacrificing the overall space of the cell structures, a different structural improvement is demanded.

Information disclosed in this Background section has already been known to the inventors before achieving the disclosure of the present application or is technical information acquired in the process of achieving the disclosure. Therefore, it may contain information that does not form the prior art that is already known to the public.

SUMMARY

Various embodiments of the inventive concept are directed to a standard cell architectures for logic circuits formed by vertical field effect transistors (VFETs).

These embodiments provide improved cell architectures which include square-shape top source/drain (S/D) contact structures for internal routing between the VFETs and super vias for a gate connection, whereby a cell architecture having reduced dimensions.

According to an embodiment, there is provided a cell architecture which may include: a plurality of VFETs formed on a substrate to constitute a logic circuit; a $1^{st}$ top S/D contact structure formed on a $1^{st}$ top S/D region of a $1^{st}$ VFET and connected to a $1^{st}$ horizontal metal pattern formed thereon and extended in an X-direction of the cell architecture to connect an output signal of the logic circuit output from the $1^{st}$ top S/D region to a $1^{st}$ vertical metal pattern; a $2^{nd}$ top S/D contact structure formed on a $2^{nd}$ top S/D region of a $2^{nd}$ VFET and connected to a $2^{nd}$ horizontal metal pattern formed thereon and extended in the X-direction to connect the output signal of the logic circuit output from the $2^{nd}$ top S/D region to the $1^{st}$ vertical metal pattern; and a gate contact structure formed on a gate connection pattern connected to respective gates of the $1^{st}$ and $2^{nd}$ VFETs, the gate contact structure being connected to an input signal of the logic circuit through a super via (SPV).

In the above embodiment, the $1^{st}$ VFET and the $2^{nd}$ VFET may be formed along a $1^{st}$ fin structure extended in a Y-direction of the cell architecture, and both of the $1^{st}$ top S/D contact structure and the $2^{nd}$ top S/D contact structure may have a substantially-square shape in a plan view of the cell architecture.

According to an embodiment, there is also provided a cell architecture which may include: $1^{st}$-type top S/D contact structures respectively formed on top S/D regions of at least two of VFETs constituting a logic circuit, respectively; at least one gate contact structure connected to at least one gate connection pattern connecting gates of the two of the VFETs to each other; $1^{st}$ metal patterns extended in a Y-direction and configured to receive one or more input signals of the logic circuit, and transmit out an output signal of the logic circuit; and $2^{nd}$ metal patterns extended in an X-direction and provided for internal routing of the logic circuit by connecting at least two of the $1^{st}$-type top S/D contact structures to one of the $1^{st}$ metal patterns to transmit out the output signal.

In the above embodiment, the two of the $1^{st}$-type top S/D contact structures may have a substantially-square shape in a plan view of the cell architecture, and the $1^{st}$ metal patterns may be formed at a higher level than the $2^{nd}$ metal patterns which are formed at a higher level than the $1^{st}$-type top S/D contact structures According to an embodiment, there is also provided a cell architecture which may include: top source/drain (S/D) contact structures respectively formed on top S/D regions of at least two of vertical field-effect transistors (VFETs) constituting a logic circuit, respectively; at least one gate contact structure connected to at least one gate connection pattern connecting gates of the two of the VFETs to each other; $1^{st}$ metal patterns extended in a Y-direction and configured to receive one or more input signals of the logic circuit and transmit out an output signal of the logic circuit; $2^{nd}$ metal patterns extended in an X-direction and provided for internal routing of the logic circuit by connecting at least two of the top S/D contact structures to one of the $1^{st}$ metal patterns to transmit out the output signal; and at least one super via formed on the gate contact structure and connected to another one of the $1^{st}$ metal patterns to receive one of the input signals.

In the above embodiment, the $1^{st}$ metal patterns may be formed at a higher level than the $2^{nd}$ metal patterns which are formed at a higher level than the top S/D contact structures.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION

Figure 1A:
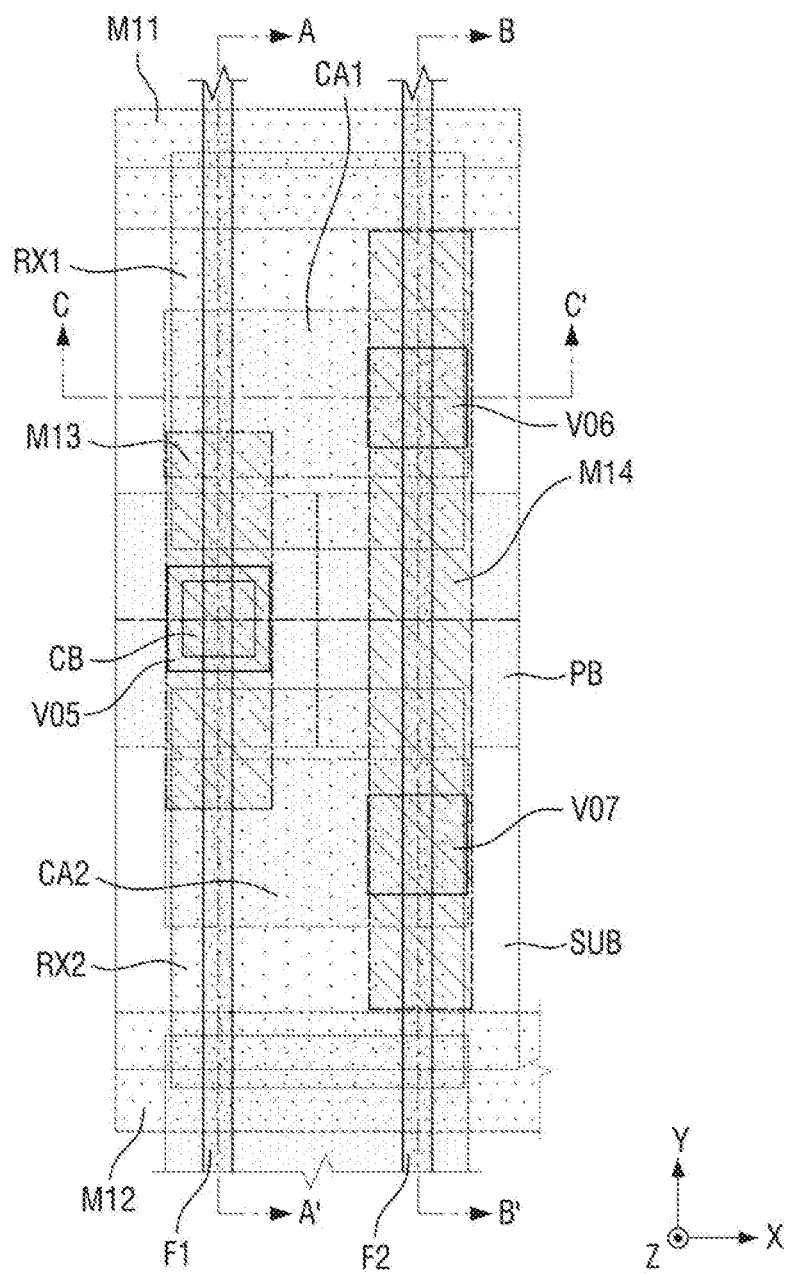
FIGS. 1A-1E illustrate portions of a related art cell architecture provided for a two-fin inverter.
Figure 1B:
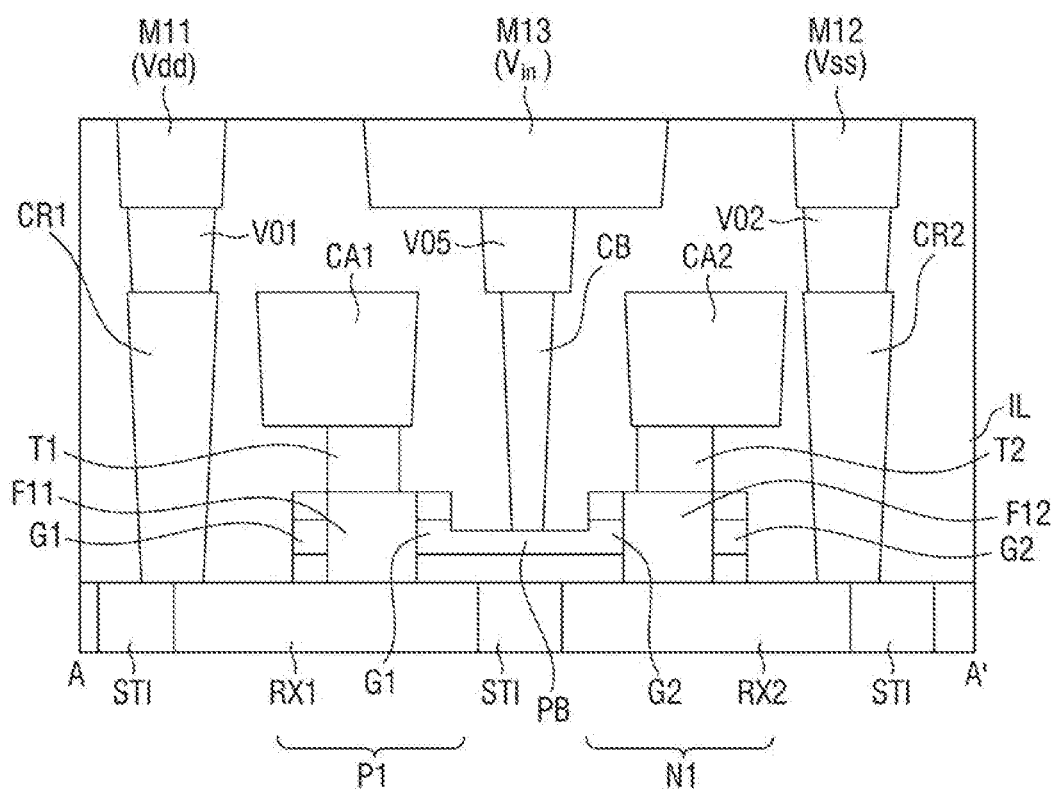
Figure 1C:
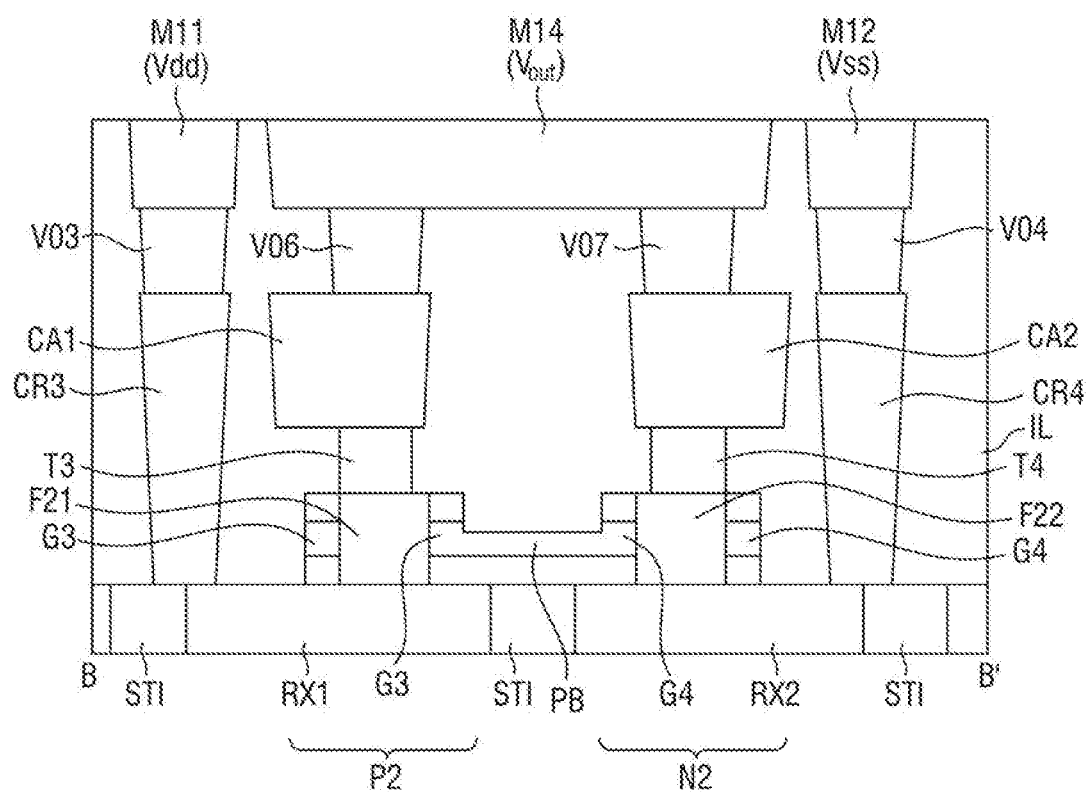
Figure 1D:
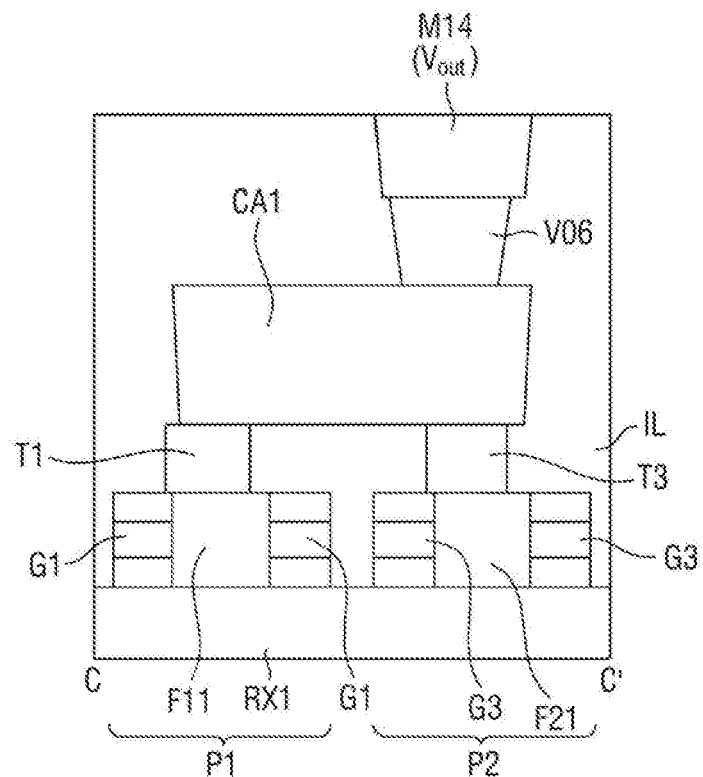

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1E:
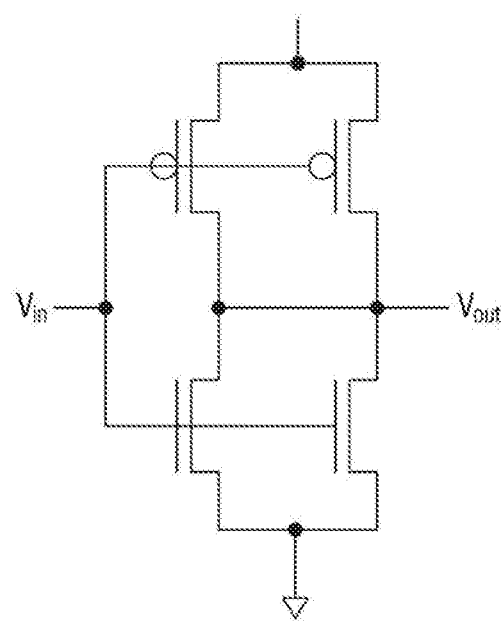
Figure 3A:
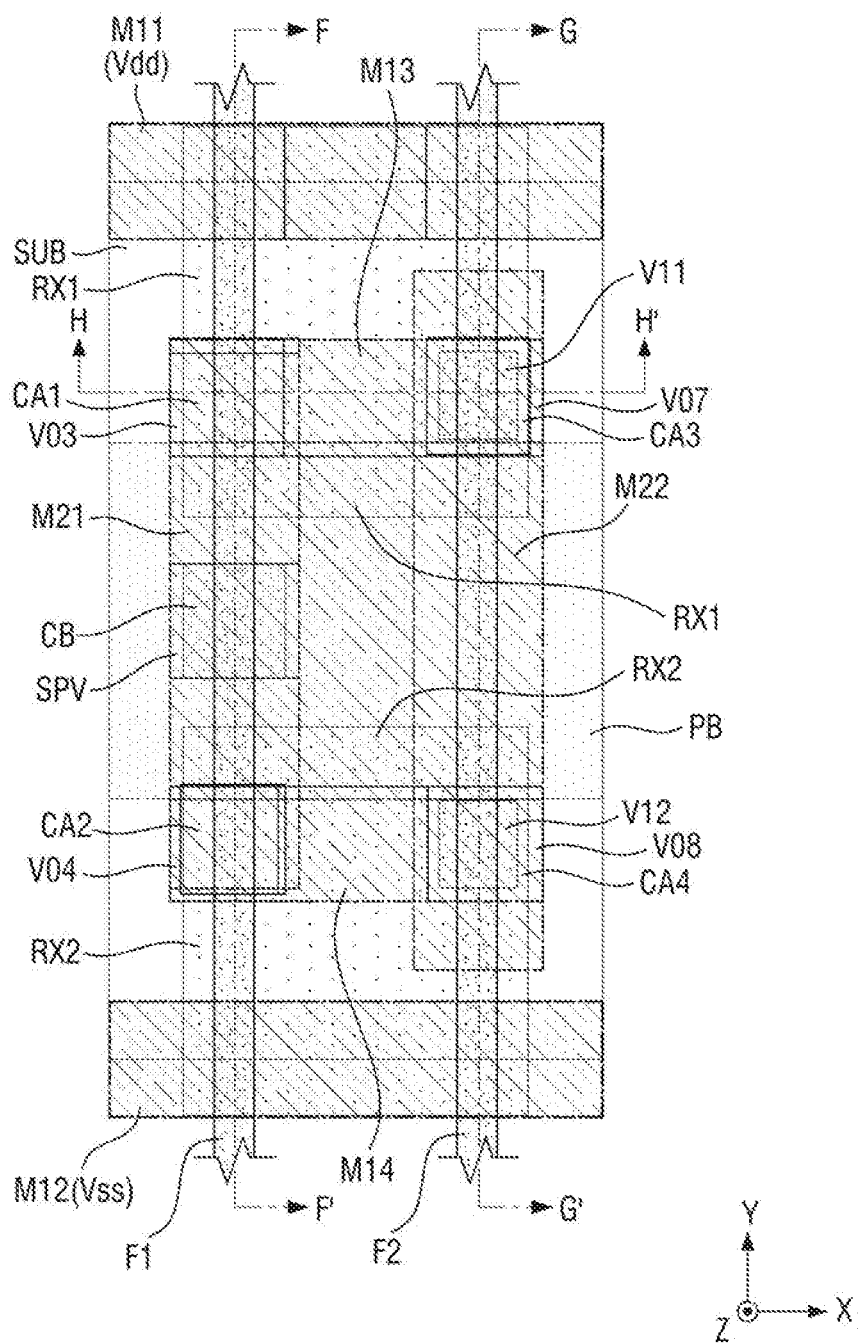
FIGS. 3A-3D illustrate portions of a cell architecture provided for a two-fin inverter according to an embodiment.
Figure 3B:
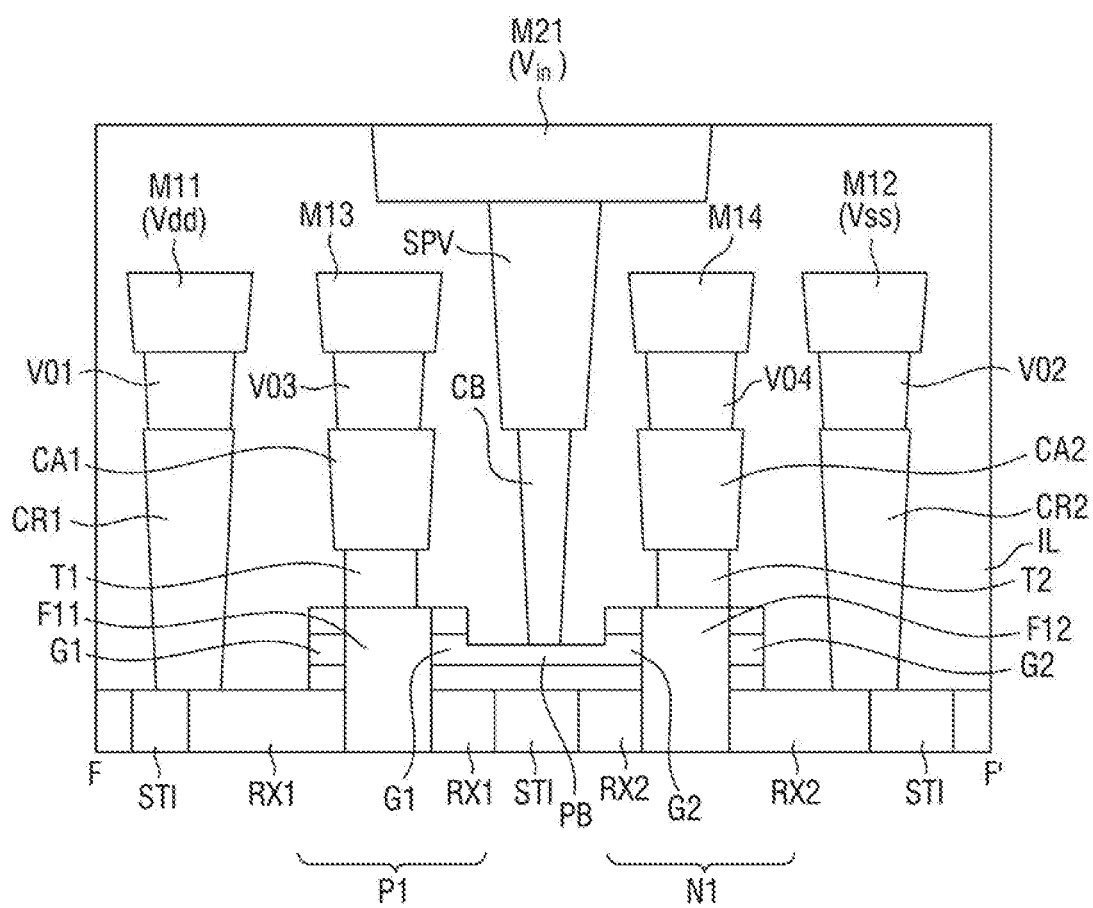
Figure 3C:
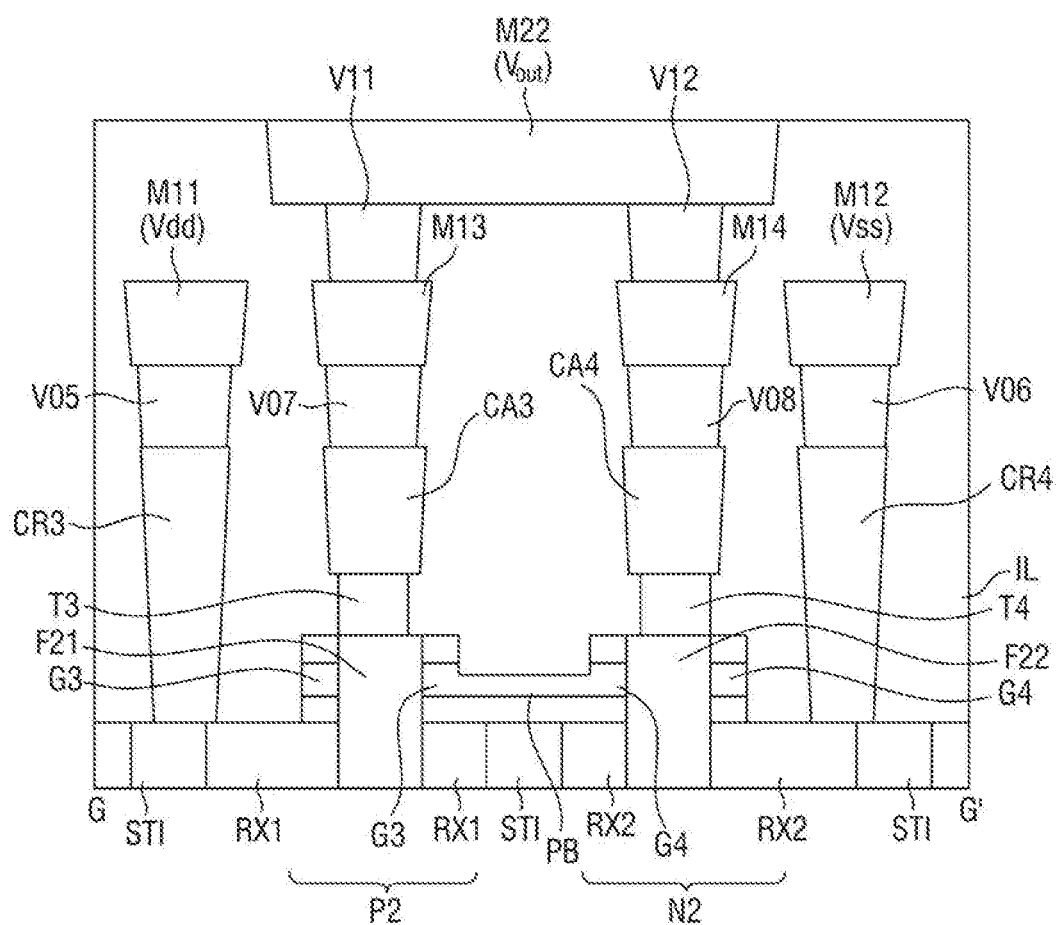
Figure 3D:
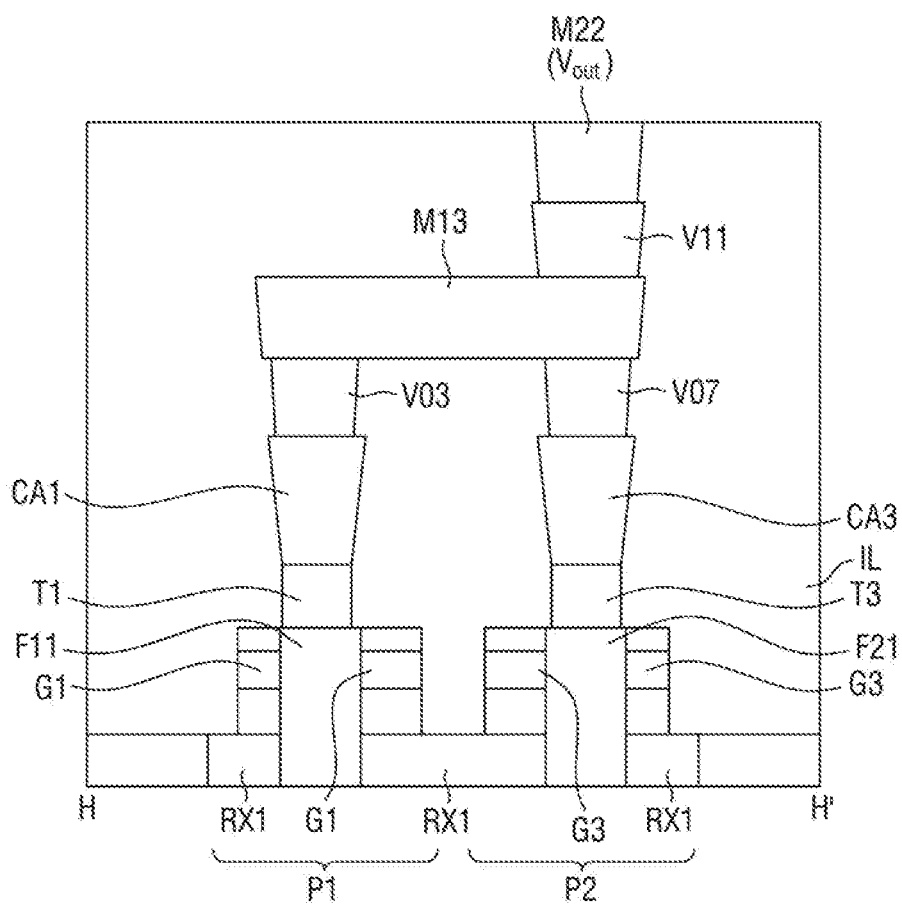

FIGS. 3A-3D illustrate portions of a cell architecture viewed in different directions according to an embodiment. Like the cell architecture shown in FIGS. 1A-1D, the cell architecture according to the present embodiment may be provided for constituting a logic circuit such as a two-fin inverter formed by a plurality of VFETs using two fin structures F1 and F2 shown in FIG. 3A. The two-fin inverter implemented by the cell architecture of FIGS. 3A-3D can be represented by the same schematic of the two-fin inverter illustrated in FIG. 1E. FIG. 3A illustrates a top plan view of the cell architecture, and FIGS. 3B-3D illustrate cross-section views of the cell architecture taken along lines F-F', G-G' and H-H', respectively. It is noted however that some elements shown in any one of FIGS. 3A-3D may not be seen at least one another one of FIGS. 3A-3D for brevity purposes Since the VFETs forming the two-fin inverter in the cell architecture of the present embodiment have the same or a substantially same structures compared to the VFETs included in the related-art cell architecture of FIGS. 1A-1D, redundant descriptions are omitted herein. However, the cell architecture according to the present embodiment differs from the related art cell architecture at least in the structural shape of top S/D contact structures, metal patterns formed thereon through which an input signal and an output signal of the inverter are received and transmitted out, and a via structure formed on a gate contact structure, which will be described in detail herebelow.

Unlike the cell architecture shown in FIGS. 1A-1D, the cell architecture according to the present embodiment provides top S/D contact structures CA1 to CA4 on the top S/D regions T1 to T4 of the PMOS P1, the NMOS N1, the PMOS P2 and the NMOS N2, respectively, as shown in FIGS. 3A-3D. Moreover, these top S/D contact structures CA1 to CA4 have a square shape in the plan view of the cell architecture as shown in FIGS. 3A-3D.

Further, in order to connect the square-shaped top S/D contact structure CA1 of the PMOS P1 and the square-shaped top S/D contact structure CA3 of the PMOS P2, a horizontal metal pattern M13 is formed and connected to the two square-shaped S/D contact structures CA1 and CA3 through respective vias V03 and V07, as shown in FIGS. 3A3D. In parallel, in order to connect the square-shaped top S/D CA2 of the NMOS N1 and the square-shaped top S/D contact structure CA4 of the NMOS N2, another horizontal metal pattern M14 is formed and connected to the two square-shaped S/D contact structures CA2 and CA4 through respective vias V04 and V08, as shown in FIGS. 3A-3D.

These two horizontal metal patterns M13 and M14 are extended in the X-direction in parallel.

Referring to FIGS. 3A-3C, bottom S/D regions RX1 and RX2 of the VFETs are respectively connected to a power rail Vdd and a ground rail Vss through power contact structures CR1 and CR2, and respective vias V01, V02, V05 and V06.

While the corresponding top S/D region T1 of the PMOS P1 and the corresponding top S/D region T3 of the PMOS P2 shown in the related art cell architecture of FIGS. 1A-1D are connected to each other through the bar-shaped S/D contact structure CA1, the top S/D region T1 of the PMOS P1 and the top S/D region T3 the PMOS P2 shown in FIGS. 3A and 3D are connected to each other through the respective square-shaped top S/D contact structures CA1 and CA3 and the horizontal metal pattern M13 connected thereto through the respective vias V03 and V07. In a similar manner, the top S/D region T2 of the NMOS N1 and the top S/D region T4 of the NMOS N2 are connected to each other through the respective square-shaped S/D contact structures CA2 and CA4 and the horizontal metal pattern M14 connected thereto through respective vias V04 and V08.

The metal pattern M13 connect the top S/D region T1 of the PMOS P1 to the top S/D region T3 of the PMOS P2 for transmitting out an output signal $V_{out}$ of the inverter, and the metal pattern M14 connect the top S/D region T2 of the NMOS N1 to the top S/D region T4 of the NMOS N2 for transmitting out the same output signal $V_{out}$ of the inverter. Thus, these two metal patterns M13 and M14 may be referred to as an internal routing metal pattern. The two horizontal metal patterns M13 and M14 are connected to each other by a vertical metal pattern M22 through vias V11 and V12 respectively formed thereon. The vertical metal pattern M22 extended in the Y-direction may be connected to an outside circuit to which the output signal $V_{out}$ of the inverter is transmitted.

The square-shaped top S/D contact structures CA1 to CA4 can have a smaller width in the Y-direction in the plan view of the cell architecture compared to the bar-type top S/D contact structures CA1 and CA2 of the related art cell architecture shown in FIGS. 1A-1D, and thus, the cell architecture according to the present embodiment may be able to achieve a cell architecture having smaller cell height in the Y-direction. Further, since the horizontal metal patterns M13 and M14 for internal routing for a logic circuit are used, the cell architecture according to the present embodiment is able to provide additional routing resources to constitute a more complicated logic circuit.

The plan view shape of the top S/D contact structures CA1 to CA4 for a cell architecture according to the present embodiment is not limited to a precise square. As long as the shape of these S/D contact structures are small enough to contribute reducing the cell height of the cell architecture, a substantially-square shape may be sufficient to form the top S/D contact structures CA1 to CA4 for the VFET cell architecture under the inventive concept.

Now, referring to FIGS. 3A and 3B, a gate connection pattern PB is formed between the PMOS P1, the NMOS N1, the PMOS P2 and the NMOS N2 to connect respective gates thereof, and a gate contact structure CB is formed on the gate connection pattern PB. This structure of the gate connection pattern PB and the gate contact structure CB is the same as those of the related art cell architecture for the inverter as shown in FIGS. 1A-1D. However, due to the square-shaped top S/D contact structures CA1 to CA4 respectively formed on the top S/D regions T1 to T4 of the four VFETs, and the two horizontal metal patterns M13 and M14 formed thereon through the respective vias V03, V04, V07 and V08, the cell architecture for the inverter according to the present embodiment provides a super via SPV on which a vertical metal pattern M21 is formed so that an input signal $V_{in}$ of the inverter is input to the vertical metal pattern M21. This super via SPV is configured to be taller than the other vias such as V01 to V08 used in the cell architecture according to the present embodiment. Further, the super via SPV is configured to be taller than the via V05 formed between the metal pattern M13 and the gate contact structure CB in FIG. 1B of the related-art cell architecture.

Since the super via SPV having a greater height in a Z-direction compared to the other vias is used, the cell architecture according to the present embodiment may be able to dispense with a metal pattern to be formed on or below other vias for connection with the power rail Vdd, the ground rail Vss or another circuit, whereby the least an area or space for such metal pattern does not need to be secured in the cell architecture.

In the cell architecture of FIGS. 3A-3D, the vias V03, V04, V07 and V08 are respectively formed on the top S/D contact structures CA1 to CA4, to connect these top S/D contact structures CA1 to CA4 with the horizontal metal patterns M13 and M14, respectively. However, the top S/D contact structure CA1 and the via V03 can be replaced by a taller top S/D contact structure dispensing with the via V03 according to an embodiment. This embodiment of using a taller top S/D contact structure can also be applied to the top S/D contact structure CA2 and the via V04, the top S/D contact structure CA3 and the via V07, the top S/D contact structure CA4 and the via V08, the power contact structure CR1 and the via V01, the power contact structure CR2 and the via V02, the power contact structure CR3 and the via V05, and the power contact structure CR4 and the via V06. Thus, the cell architecture according to the present embodiment does not need the vias V04, V07, V08, V01, V02, V05 and V06 to constitute a two-fin inverter formed by a plurality of VFETs, as shown in FIGS. 4A-4C.

Figure 4A:
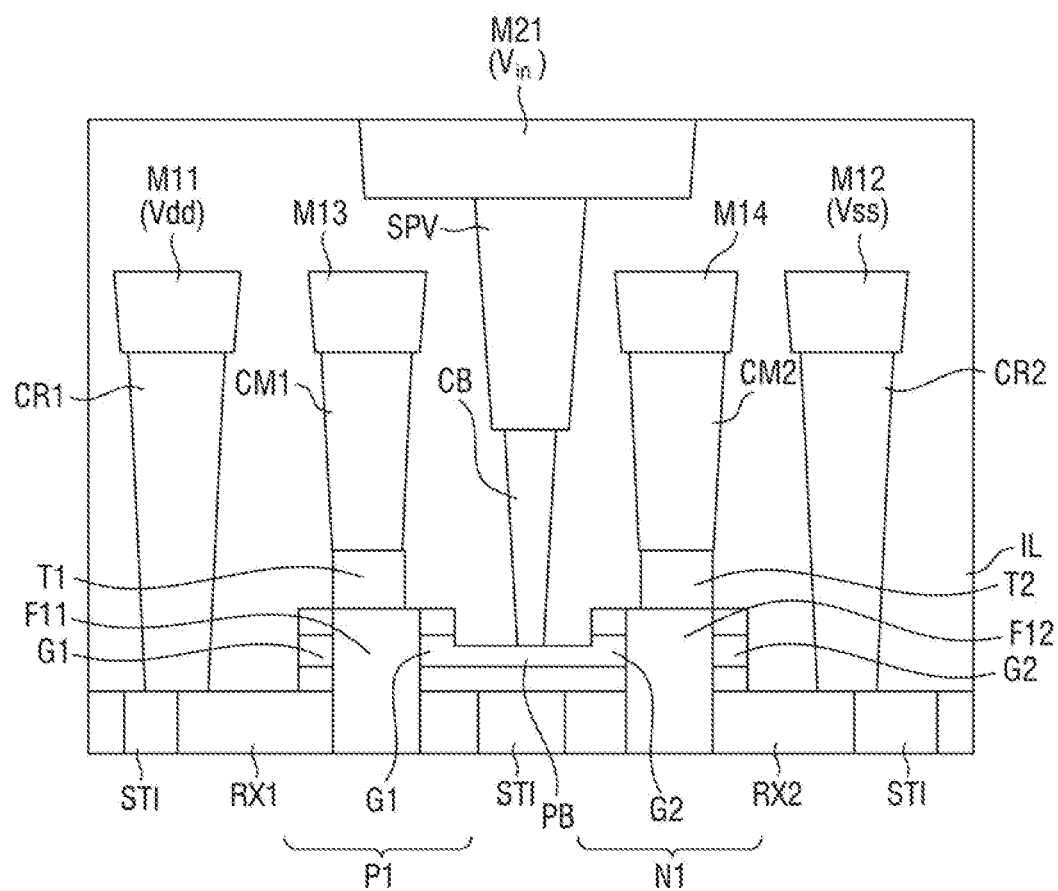
FIGS. 4A-4C illustrate portions of a cell architecture provided for a two-fin inverter according to another embodiment.
Figure 4B:
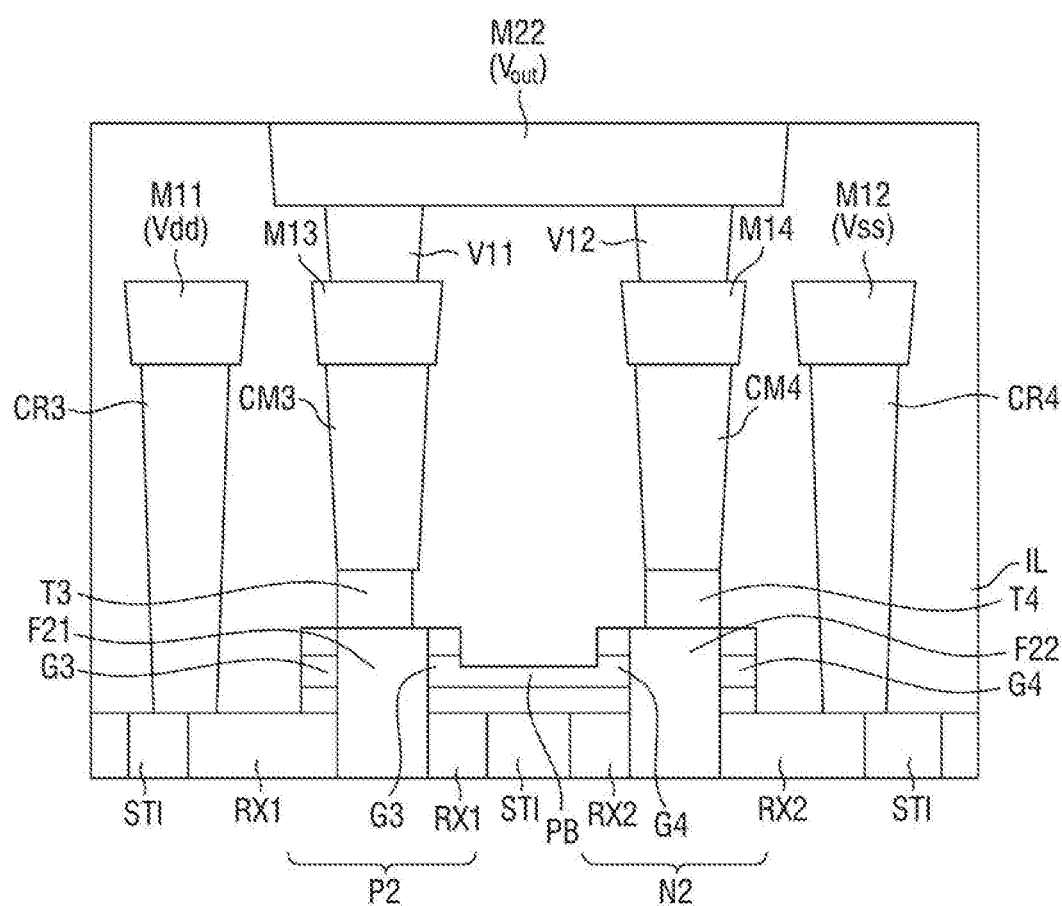
Figure 4C:
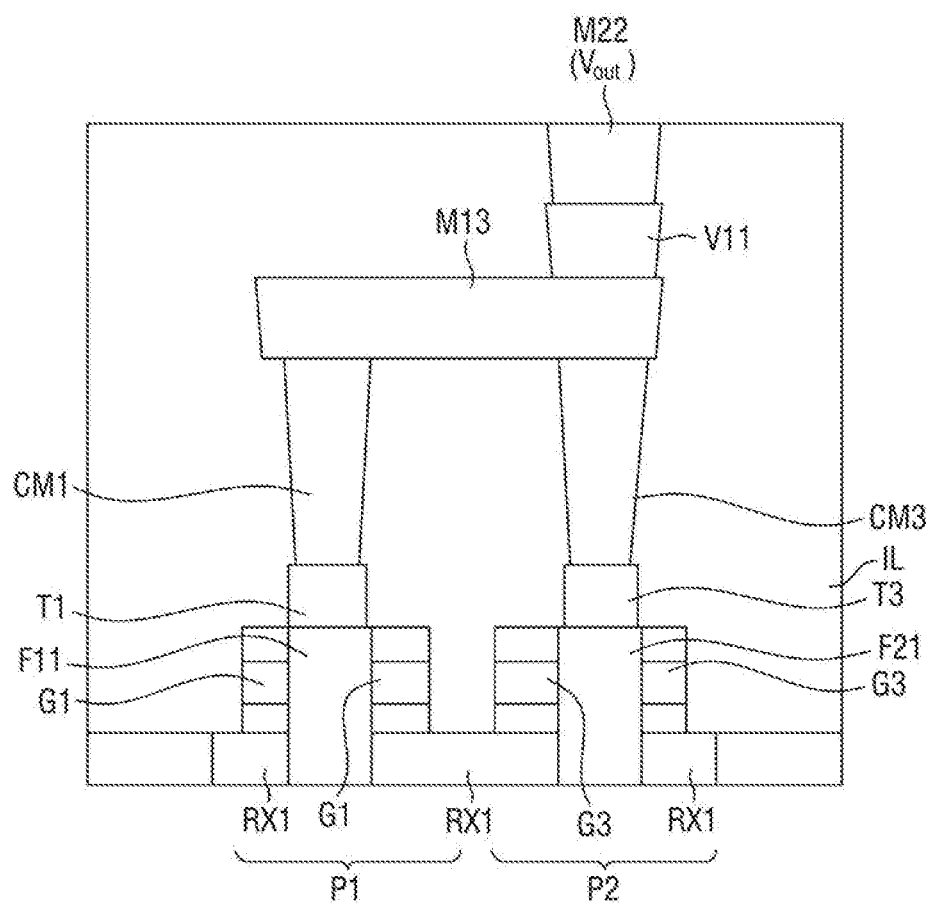

Referring to FIGS. 4A-4C, the structure of the cell architecture according to the present embodiment is different from that of the cell architecture shown in FIGS. 3A-3D in that top S/D contact structures CM1 to CM4 of the PMOS P1, the NMOS N1, the PMOS P2 and the NMOS N2 are connected to horizontal metal patterns M13 and M14 without respective vias such as the vias V03, V04, V07 and V08 used in the cell architecture of FIGS. 3A-3D. Further, the cell architecture according to the present embodiment provides power contact structures CR1 to CR4 which are connected to metal patterns M11 and M12 connecting the power contact structures CR1 to CR4 to the power rail Vdd and the ground rail Vss without using corresponding vias such as the vias V01, V02, V05 and V06 used in the cell architecture of FIGS. 3A-3D.

Since the top S/D contact structures CM1 to CM4 according to the present embodiment can replace the top S/D contact structures CA1 to CA4 and the respective vias V03, V04, V07 and V08 in FIGS. 3A-3D, each of the top S/D contact structures CM1 to CM4 becomes taller than the top S/D contact structures CA1 to CA4. For example, the height of the top S/D contact structure CM1 in the Z-direction is equal to a sum of the heights of the top S/D contact structure CA1 and the via V03 formed thereon in FIGS. 3A-3D. Similarly, the power contact structures CR1 and CR2 in the cell architecture of the present embodiment have a greater height than the power contact structures CR1 and CR2 in FIG. 3A-3D. For example, the height of the power contact structure CR1 according to the present embodiment is equal to a sum of the heights of the power contact structure CR1 and the respective via V01 formed thereon as shown in FIG. 3B. By using these heightened top S/D contact structures CM1 to CM4 and power contact structures CR1 and CR2, a manufacturing process of the cell architecture can be simplified because no vias are formed during the manufacturing process.

However, like the cell architecture of FIGS. 3A-3D, the cell architecture of the present embodiment is also characterized in that the top S/D contact structures CM1 to CM4 have a square shape in the plan view of the cell architecture, and horizontal metal patterns M13 and M14 extended in the X-direction are used to connect the top S/D contact structures CM1 to CM4 to a vertical metal pattern M22 through vias V11 and V12 respectively formed thereon. The vertical metal pattern M22 extended in the Y-direction may be connected to an outside circuit to which the output signal $V_{out}$ of the inverter is transmitted out. Further, the cell architecture of the present embodiment also uses a super via SPV connecting a gate contact structure CB with vertical metal pattern M21 so that the input signal $V_{in}$ of the inverter is input to the vertical metal pattern M21.

By using the square-shaped top S/D contact structures CM1 to CM4 and the super via SPV, the cell architecture according to the present embodiment may also enable to achieve reduced cell architecture dimensions.

Figure 5A:
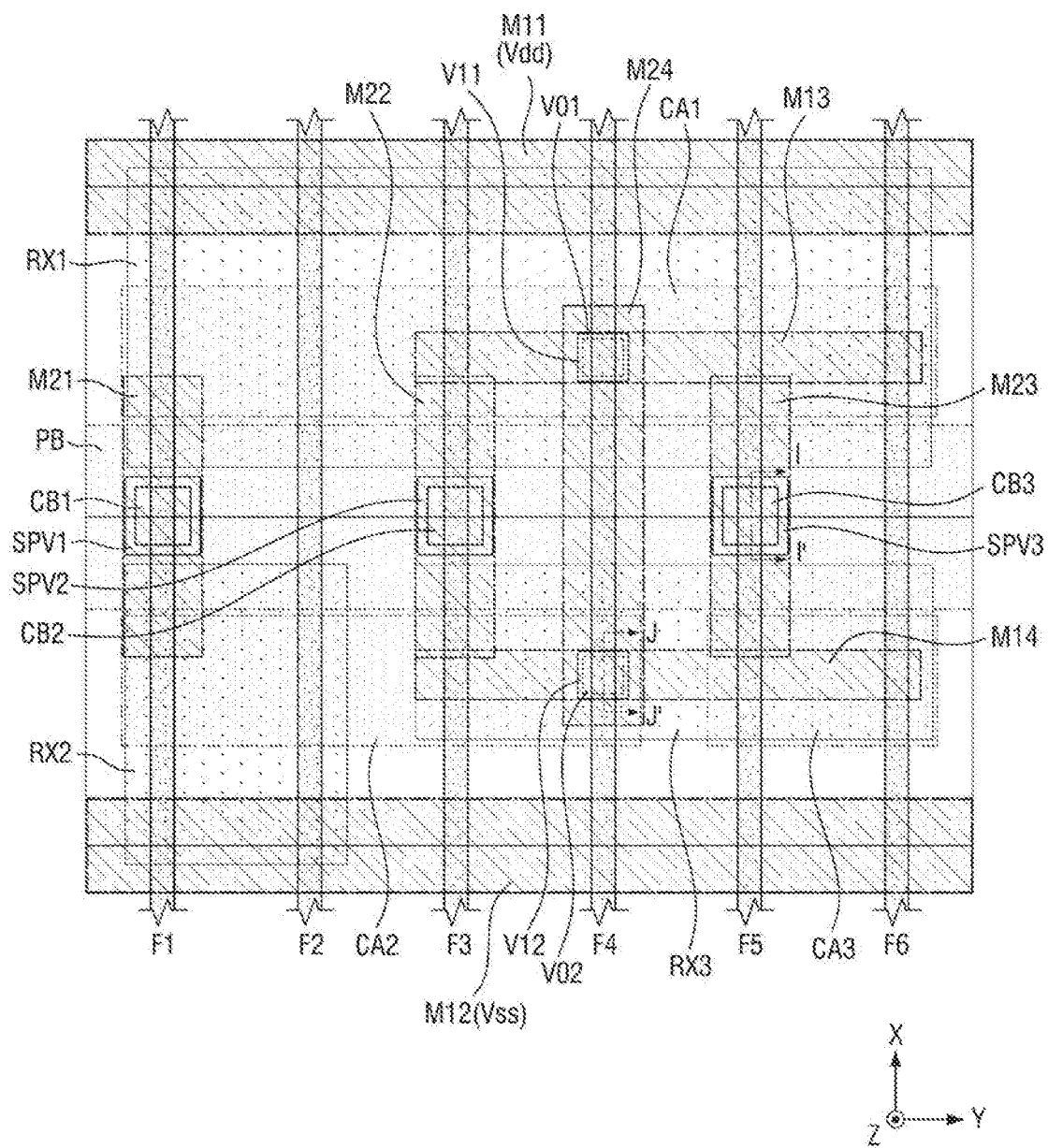
FIGS. 5A-5D illustrate portions of a cell architecture provided for a NAND3 circuit according to an embodiment.
Figure 5B:
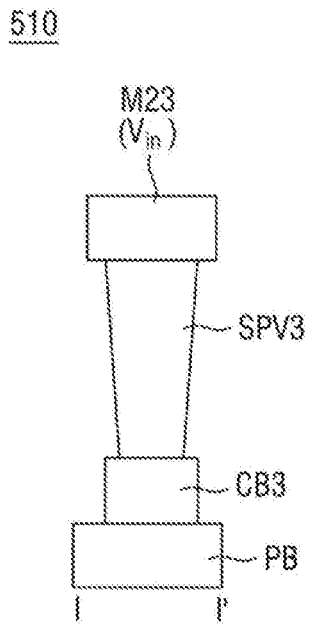
Figure 5C:
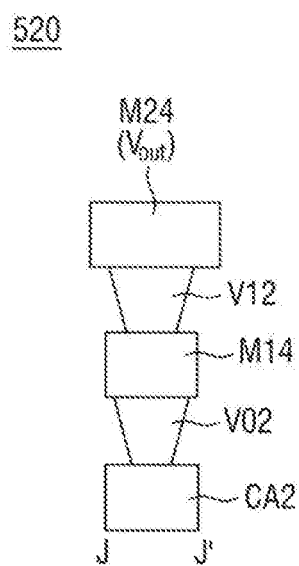
Figure 5D:
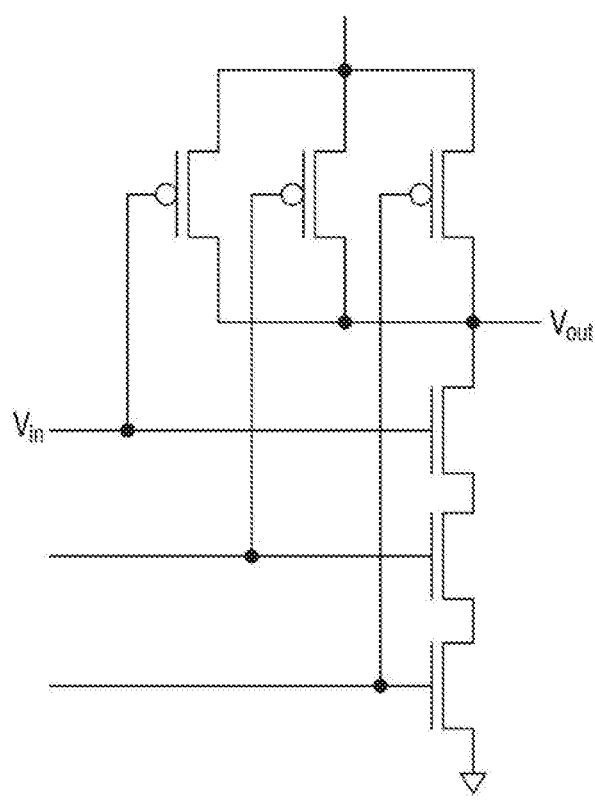

FIGS. 5A-5C illustrate portions of a cell architecture provided for constituting a logic circuit such as a NAND3 circuit formed by a plurality of VFETs, according to an embodiment. FIG. 5D illustrates a schematic of the NAND3 circuit implemented by the cell architecture of FIGS. 5A-5C. FIG. 5A illustrates a top plan view of the cell architecture for the NAND3 circuit, and FIGS. 5B and 5C illustrate portions of cross-section views of the cell architecture taken along lines I-I' and J-J', respectively. It is noted however that some elements shown in any one of FIGS. 5A-5C may not be seen at least one another one of FIGS. 5A-5C for brevity purposes.

Referring to FIG. 5A, the cell architecture according to the present embodiment provides a plurality of equally-pitched fin structures F1 to F6, along which three PMOSs and three NMOSs shown in the schematic of the NAND3 circuit of FIG. 5D can be formed.

FIG. 5A also shows bottom S/D regions RX1, RX2 and RX3, a gate connection pattern PB, gate contact structures CB1 to CB3, top S/D contact structures CA1, CA2 and CA3, super vias SPV1 to SPV3 and vias V01, V02, V11, and V12, metal patterns M21 to M24 for receiving input signals $V_{in}$ and transmitting out an output signal $V_{out}$ of the NAND3 circuit, metal patterns M13 and M14 for internal routing, and metal patterns M11 and M12 for connections to a power rail Vdd and a ground rail Vss.

Referring to FIG. 5B, the cell architecture according to the present embodiment provides a super via structure 510 including the super via SPV3 which receives one of the input signals $V_{in}$, that is, gate signals, of the NAND3 circuit.

FIG. 5C shows a metal/via/contact structure 520 for internal routing of the top S/D contact structure CA2 and transmitting out the output signal $V_{out}$ of the NAND3 circuit in the cell architecture according the present embodiment. The metal pattern M14 shown in FIG. 5C is also used for internal routing between the VFETs of the NAND3 circuit in the cell architecture according to the present embodiment.

Similar to the super via SPV for the inverter as shown in FIGS. 3A and 3B, the super via SPV3 of FIGS. 5A-5B is formed between the gate contact structure CB3 formed on the gate connection pattern PB and a vertical metal pattern M23 to which one of the input signals $V_{in}$ of the NAND3 circuit is input. Thus, a height of the super via SPV3 in the Z-direction is the same or substantially the same as a sum of the heights of the via V02, the metal pattern M14 and the via V12 sequentially formed on the top S/D contact structure CA2 in the metal/via/contact structure 520 as shown in FIG. 5C.

Like the super via SPV for the inverter as shown in FIGS. 3A and 3B, the super via structure 510 of FIG. 5B may be able to contribute to reducing a cell height of a cell architecture by dispensing with a minimum dimension required for a metal pattern such as the metal pattern M14 included in the metal/via/contact structure 520. Here, the minimum dimension for the metal pattern includes a length of an upper surface of the metal pattern M13 in the Y-direction in a plan view of the cell architecture.

Figure 2A:
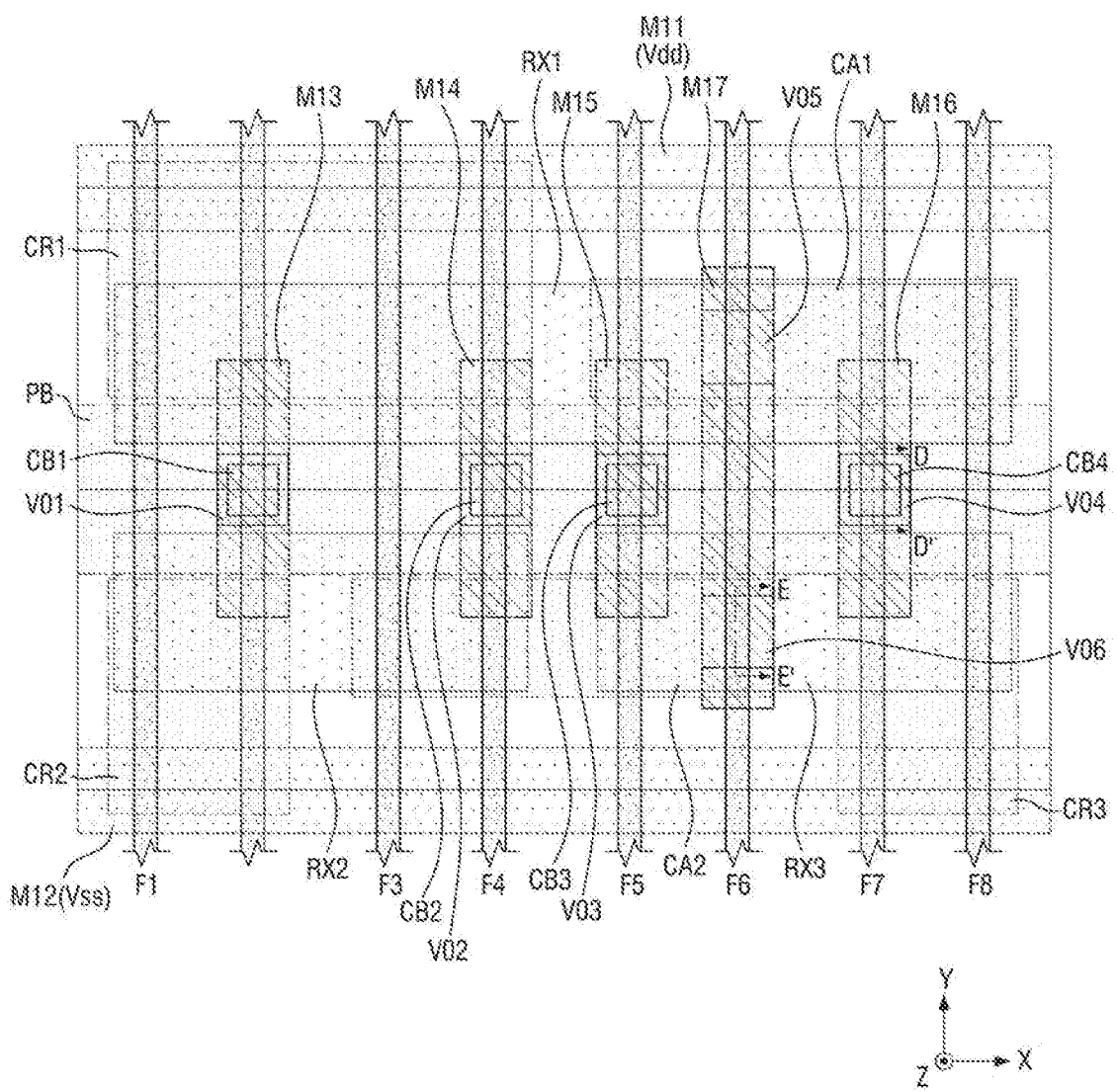
FIGS. 2A-2D illustrate portions of a related art cell architecture provided for an AOI22 circuit.
Figure 2B:
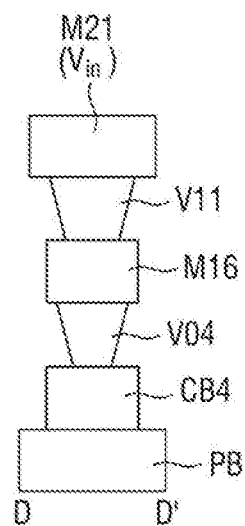
Figure 2C:
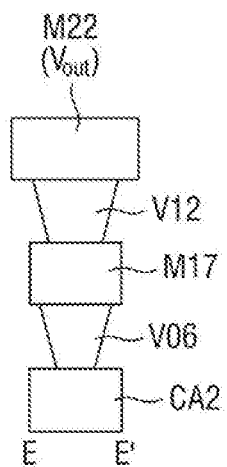
Figure 6A:
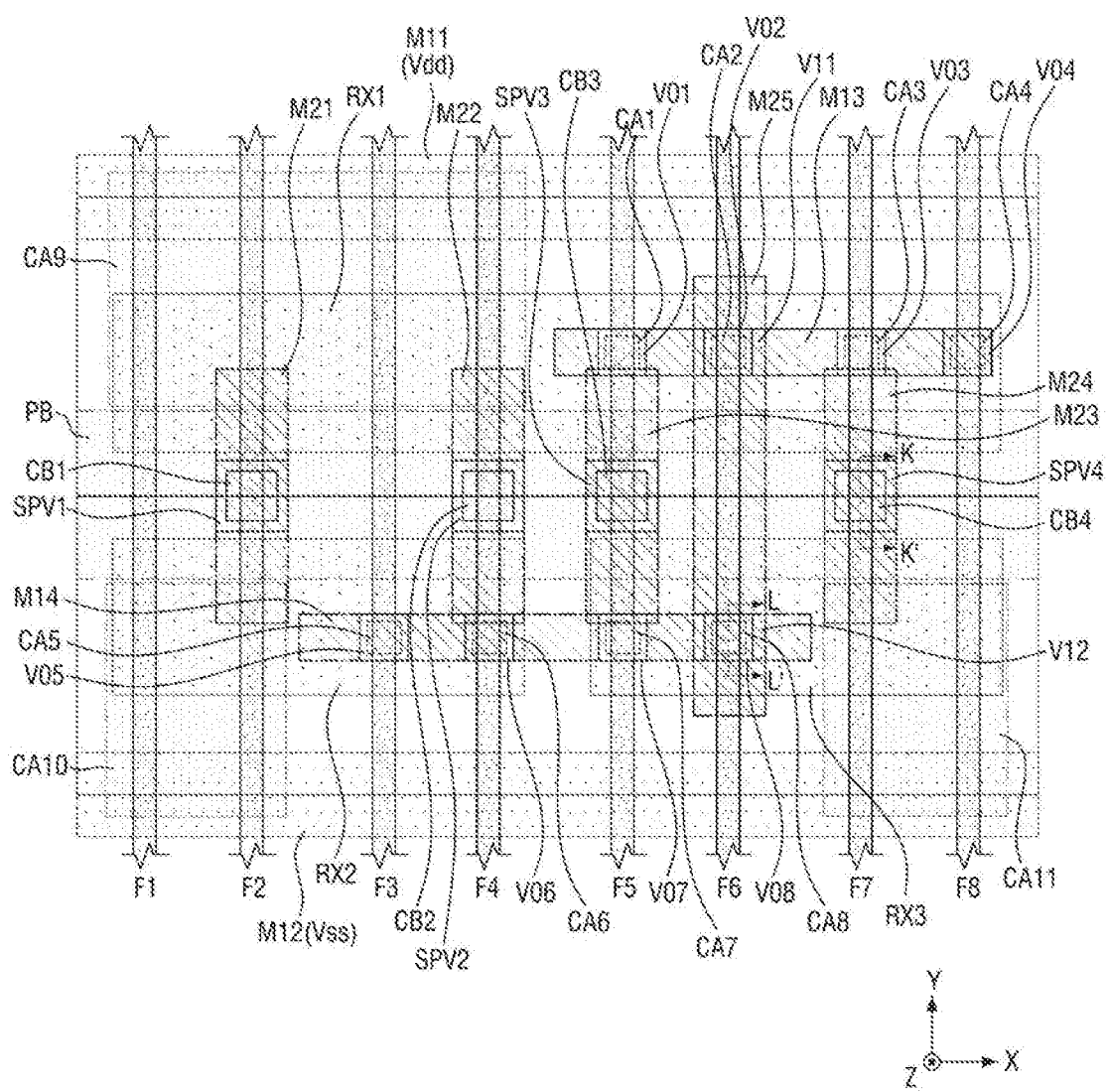
FIGS. 6A-6C illustrate portions of a cell architecture provided for a two-fin AOI22 circuit according to an embodiment.
Figure 6B:
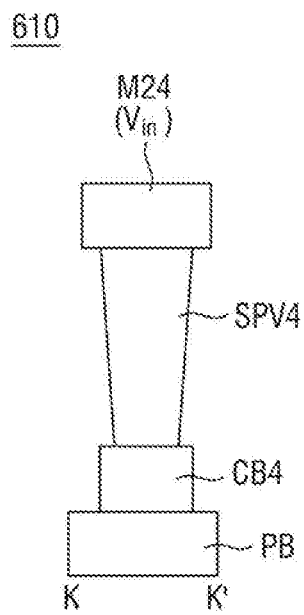
Figure 6C:
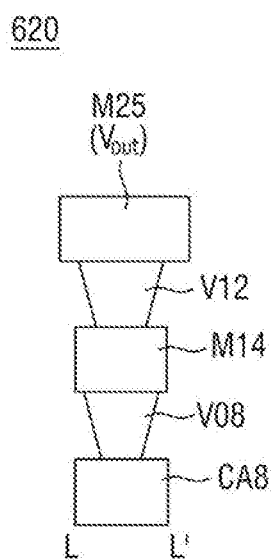

FIGS. 6A-6C illustrate portions of a cell architecture provided for constituting a logic circuit such as a two-fin AOI22 circuit formed by a plurality of VFETs according to an embodiment. This AOI22 circuit is equivalent to the AOI22 circuit described above in reference to FIGS. 2A-2D except that the cell architecture is different. FIG. 6A illustrates a top plan view of the cell architecture for the AOI22 circuit, and FIGS. 6B and 6C illustrate portions of cross-section views of the cell architecture taken along lines K-K' and L-L', respectively. It is noted however that some elements shown in any one of FIGS. 6A-6C may not be seen at least one another one of FIGS. 6A-6C for brevity purposes Referring to FIG. 6A, the cell architecture according to the present embodiment provides a plurality of equally-pitched fin structures F1 to F8, along which eight PMOSs and eight NMOSs can be formed similar to FIG. 2A.

FIG. 6A also shows bottom S/D regions RX1, RX2 and RX3, a gate connection pattern PB, gate contact structures CB1 to CB4, top S/D contact structures CA1 to CA11, super vias SPV1 to SPV4 and vias V01 to V08, V11 and V12, metal patterns M13 and M14 for internal routing, metal patterns M21-M25 for receiving input signals $V_{in}$ and transmitting out an output signal $V_{out}$ of the AOI22 circuit, metal patterns M11 and M12 for connections to a power rail Vdd and a ground rail Vss.

Referring to FIG. 6B, the cell architecture according to the present embodiment provides a super via structure 610 including the super via SPV4 which receives one of the input signals $V_{in}$, that is, gate signals, of the AOI22 circuit.

FIG. 6C shows a metal/via/contact structure 620 for internal routing of the top S/D contact structure CA8 and transmitting out the output signal $V_{out}$ of the AOI22 circuit in the cell architecture according the present embodiment. The metal pattern M14 shown in FIG. 6C is also used for internal routing between the VFETs of the AOI22 circuit in the cell architecture according to the present embodiment.

Similar to the super via for the inverter as shown in FIGS. 3A and 3B, the super via SPV4 of FIGS. 6A-6B is formed between the gate contact structure CB4 formed on the gate connection pattern PB and the metal pattern M24 to which one of the input signals $V_{in}$ of the AOI22 circuit is input. Thus, a height of the super via SPV4 in the Z-direction is the same or substantially the same as a sum of the heights of the via V08, the metal pattern M14 and the via V12 sequentially formed on the top S/D contact structure CA8 in the metal/via/contact structure 620 as shown in FIG. 6C. Like in the previous embodiments, the super via structure 610 should also contribute to reducing a cell height of a cell architecture.

In addition, the cell structure shown in FIGS. 6A-6C is characterized by two types of top S/D contact. The $1^{st}$-type of S/D contact structure includes the top S/D contact structures CA9 to CA11, and the second type of S/D contact structure includes the top S/D contact structures CA1 to CA8. The 1$^{st}$-type of S/D contact structure has a bar shape in a plan view of the cell architecture, and extended in the X and Y directions so that they can connect corresponding VFETs to the power rail Vdd and the ground rail Vss through the metal patterns M11 an M12. However, the second type of S/D contact structure for the internal routing has a square shape in the plan view of the cell architecture, which may be able to reduce the cell height of the cell structure as explained above in reference to FIGS. 3A-3D. In addition, due to the reduced area size, the square-shaped CA structure may enable the cell architecture to secure a space between the gate contact structure CB and adjacent vias, and a space between the 1$^{st}$-type S/D contact structures and the second type S/D contact structures.

Figure 7A:
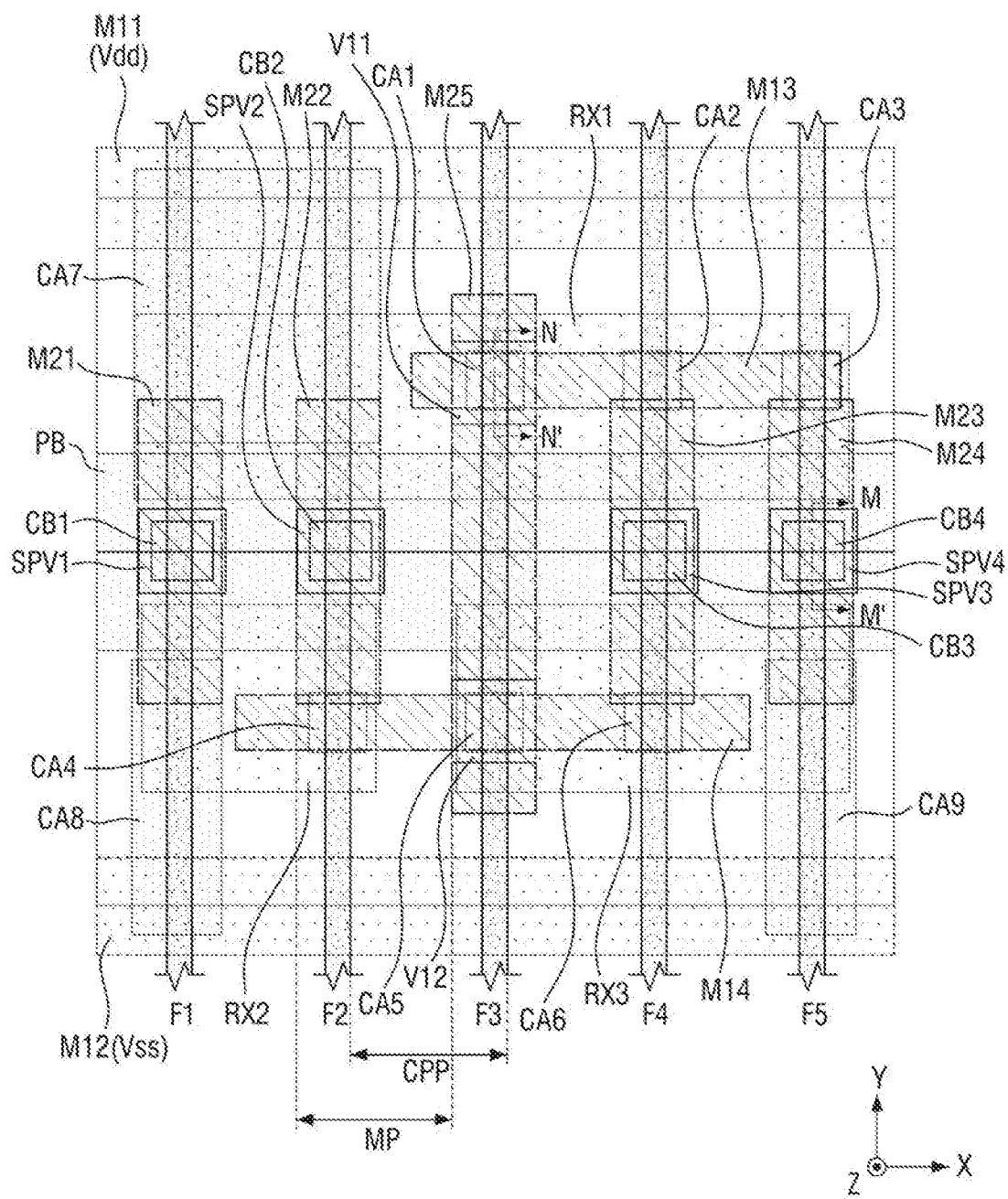
FIGS. 7A-7C illustrate portions of a cell architecture provided for a one-fin AOI22 circuit according to an embodiment.
Figure 7B:
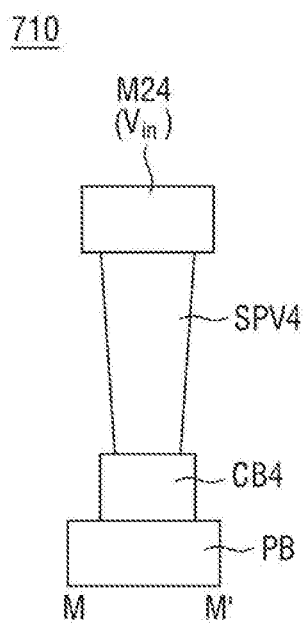
Figure 7C:
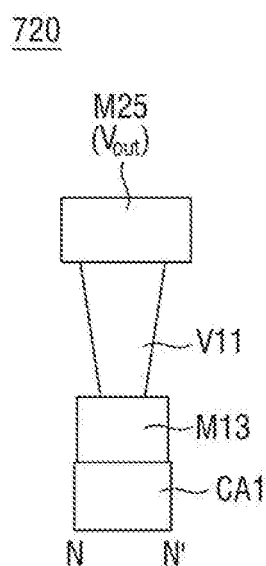

FIGS. 7A-7C illustrates portions of a cell architecture provided for constituting a logic circuit such as a one-fin AOI22 circuit formed by a plurality of VFETs, according to an embodiment. This one-fin AOI22 circuit is represented by the schematic shown in FIG. 2D. FIG. 7A illustrates a top plan view of the cell architecture for the AOI22 circuit, and FIGS. 7B and 7C show portions of cross-section views of the cell architecture taken along lines M-M' and N-N', respectively. It is noted however that some elements shown in any one of FIGS. 7A-7C may not be seen at least one another one of FIGS. 7A-7C for brevity purposes.

Figure 2D:
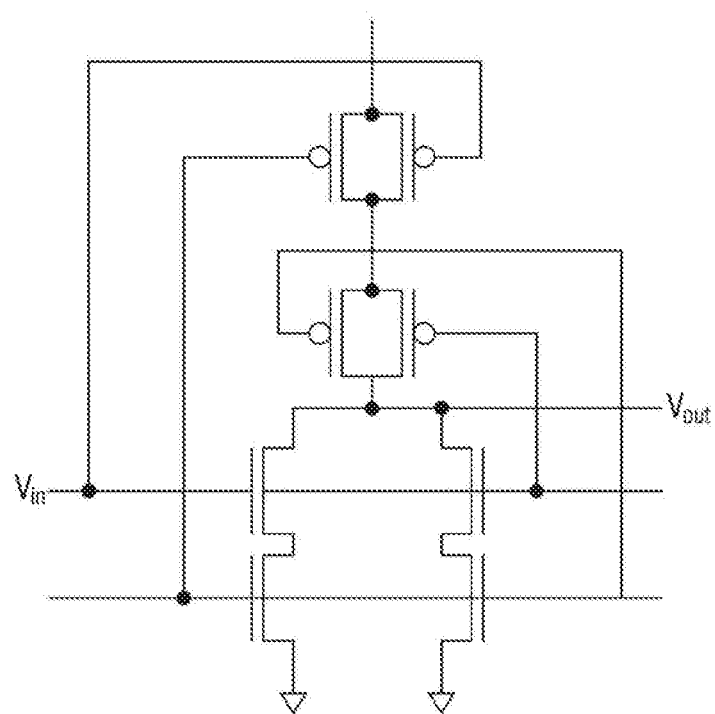

Referring to FIG. 7A, the cell architecture according to the present embodiment provides a plurality of equally-pitched fin structures F1 to F5. Along the fin structures F1, F2, F4 and F5, four PMOSs and four NMOSs as shown in FIG. 2D can be formed to constitute the one-fin AOI22 circuit.

FIG. 7A also shows bottom S/D regions RX1, RX2 and RX3, a gate connection pattern PB, gate contact structures CB1 to CB4, top S/D contact structures CA1 to CA9, super vias SPV1 to SPV4 and vias V11 and V12, metal patterns M13 and M14 for internal routing, metal patterns M21-M25 for receiving input signals V$_{in}$ and transmitting out an output signal V$_{out}$ of the AOI22 circuit, metal patterns M11 and M12 for connections to a power rail Vdd and a ground rail Vss.

Referring to FIG. 7B, the cell architecture according to the present embodiment provides a super via structure 710 including the super via SPV4 which receives one of the input signals V$_{in}$, that is, gate signals, of the AOI22 circuit.

FIG. 7C shows a metal/via/contact structure 720 for internal routing of the top S/D contact structure CA1 and transmitting out the output signal V$_{out}$ of the AOI22 circuit in the cell architecture according the present embodiment. The metal pattern M13 shown in FIG. 7C is used for internal routing between the VFETs of the AOI22 circuit in the cell architecture according to the present embodiment.

Similar to the super via structure 310 for the inverter of FIGS. 3A and 3B, the super via SPV4 of FIGS. 7A-7B is formed between the gate contact structure CB4 formed on the gate connection pattern PB and the metal pattern M24 to which one of the input signals V$_{in}$ of the AOI22 circuit is input. Here, a height of the super via SPV4 in the Z-direction is the same or substantially the same as a sum of the heights of the metal pattern M13 and the via V11 sequentially formed on the top S/D contact structure CA8 in the metal/via/contact structure 720 as shown in FIG. 7C. Like in the previous embodiments, the super via structure 710 should also contribute to reducing a cell height of a cell architecture.

Like the cell architecture shown in FIGS. 6A-6C, the cell structure shown in FIG. 7A is also characterized by two types of top S/D contact. The 1$^{st}$-type of S/D contact structure includes the top S/D contact structures CA7 to CA9, and the second type of S/D contact structure includes the top S/D contact structures CA1 to CA6. The 1$^{st}$-type of S/D contact structure has a bar shape in a plan view of the cell architecture, and extended in the X and Y directions so that they can connect corresponding VFETs to the power rail Vdd and the ground rail Vss through the metal patterns M11 and M12. However, the second type of S/D contact structure for the internal routing has a square shape in the plan view of the cell architecture, which may be able to reduce the cell height of the cell structure as explained above in reference to FIGS. 3A-3D. In addition, due to the reduced area size, the square-shaped CA structure may enable the cell architecture to secure a space between the gate contact structure CB and adjacent vias, and a space between the 1$^{st}$-type S/D contact structures and the second type S/D contact structures.

However, the cell architecture shown in FIGS. 7A-7C for the AOI22 circuit is configured to provide the metal pattern 25 formed on the fin structure F3 where a gate of a VFET for the AOI22 circuit is not formed. Thus, in this cell architecture, the ratio of grid cell gate pitch (CPP) to metal pattern pitch (MP) is 1:1, which is also referred to as a gear ratio. That is, this cell architecture requires five grid cell gate pitches which may not satisfy the minimum grid cell gate pitches for AOI22, which is four. In order to address this problem, an AOI22 circuit which can be implemented by a cell architecture having a gear ratio of 3:2 or 2:1, in which case the minimum grid cell gate pitch requirement can be met.

Figure 8A:
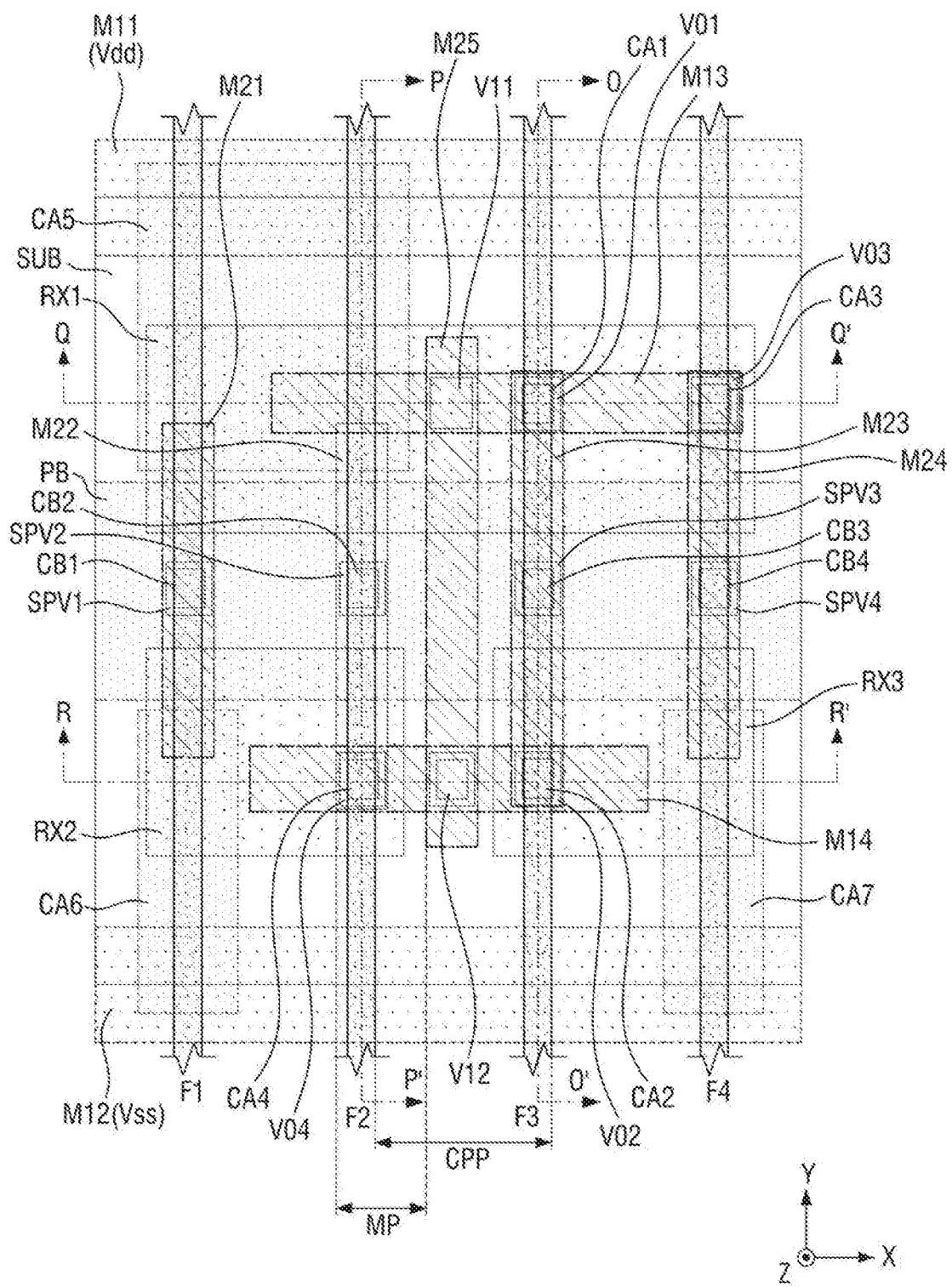
FIGS. 8A-8F illustrates portions of a cell architecture provided for a one-fin AOI22 circuit according to another embodiment.

FIGS. 8A-8F illustrates portions of a cell architecture provided for constituting a logic circuit such as a one-fin AOI22 circuit formed by a plurality of VFETs according to an embodiment. This one-fin AOI22 circuit is also represented by the same schematic shown in FIG. 2D. FIG. 8A illustrates a top plan view of the cell architecture for the AOI22 circuit, and FIGS. 8B-8E illustrate portions of cross-section views of the cell architecture taken along lines O-O', P-P', Q-Q' and R-R', respectively, marked in FIG. 8A. It is noted however that some elements shown in any one of FIGS. 8A-8E may not be seen at least one another one of FIGS. 8A-8E for brevity purposes.

Referring to FIG. 8A-8E, the cell architecture according to the present embodiment provides a plurality of equally-pitched fin structures F1 to F4, along which four PMOSs and four NMOSs as shown in FIG. 2D can be formed to constitute the one-fin AOI22 circuit.

FIGS. 8A-8E also show bottom S/D regions RX1, RX2 and RX3, a gate connection pattern PB, gate contact structures CB1 to CB4, top S/D contact structures CA1 to CA7, super vias SPV1 to SPV4 and vias V01 to V08, V11 and V12, metal patterns M13 and M14 for internal routing, metal patterns M21-M25 for receiving input signals V$_{in}$ and transmitting out an output signal V$_{out}$ of the AOI22 circuit, metal patterns M11 and M12 for connections to a power rail Vdd and a ground rail Vss.

Referring to FIG. 8A, the super vias SPV1 to SPV4 are formed on the gate contact structures CB1 to CB4 formed on the gate connection pattern PB to respectively receive four input signals V$_{in}$, that is, four gate signals, of the AOI22 circuit. Specifically, FIGS. 8B-8E show that the super vias SPV2 and SPV3 are taller than the vias V01 to V08, V11 and V12. For example, the height of the super via SPV3 in the Z-direction is the same or substantially the same as each of a sum of the heights of the via V01, the metal pattern M13 and the via V11, and a sum of the height of the via V02, the metal pattern M14 and the via V12. Here, the via V01 is formed on the top S/D contact structure CA1 to connect the PMOS1 to the metal pattern M13 which is connected to the metal pattern M25 to transmit out the output signal $V_{out}$ of the AOI22 circuit. Similarly, the via V02 is formed on the top S/D contact structure CA2 to connect the NMOS1 to the metal pattern M14 which is connected to the metal pattern M25 to transmit out the same output signal $V_{out}$ of the AOI22 circuit. The heights of the super vias SPV1 to SPV4 are the same.

The cell architecture according to the present embodiment shown in FIGS. 8A-8E are also characterized by two types of top S/D contact. The $1^{st}$-type of S/D contact structure includes the top S/D contact structures CA5 to CA7, and the second type of S/D contact structure includes the top S/D contact structures CA1 to CA4. The $1^{st}$-type of S/D contact structure has a bar shape in a plan view of the cell architecture, and extended in the X and Y directions so that they can connect corresponding VFETs to the power rail Vdd and the ground rail Vss through the power contact structures CR1 to CR4 and the metal patterns M11 and M12. However, the second type of S/D contact structure for the internal routing has a square shape in the plan view of the cell architecture, which may be able to reduce the cell height of the cell structure as explained above in reference to FIGS. 3A-3D. In addition, due to the reduced area size, the square-shaped CA structure may enable the cell architecture to secure a space between the gate contact structure CB and adjacent vias, and a space between the $1^{st}$-type S/D contact structures and the second type S/D contact structures.

Moreover, the cell architecture according to the present embodiment is configured such that the vias V01 to V08 are formed on the respective top S/D contact structures CA1 to CA4 and power contact structures CR1 to CR4 in order to prevent unwanted connections between the top S/D contact structures CA5 to CA7 for power connection and the metal patterns M13 and M14 for internal routing of the AOI22 circuit.

Alternatively, according to an embodiment similar to the embodiment of FIGS. 4A-4C, the top S/D contact structures CA1 to CA4 may be replaced by heightened top S/D contact structures CM1 to CM4 dispensing with the respective vias V01 to V04. In the same manner, the power contact structures CR1 to CR4 may also be replaced heighted CRs without using the respective vias V05 to V08. In this embodiment, the height of the alternative top S/D contact structure CM1 in the Z-direction should be the same as a sum of the heights of the top S/D contact structure CA1 and the via V01. The heights of the other alternative top S/D contact structures CM2 to CM3 is the same as the height of the alternative top S/D contact structure CM1.

Figure 8B:
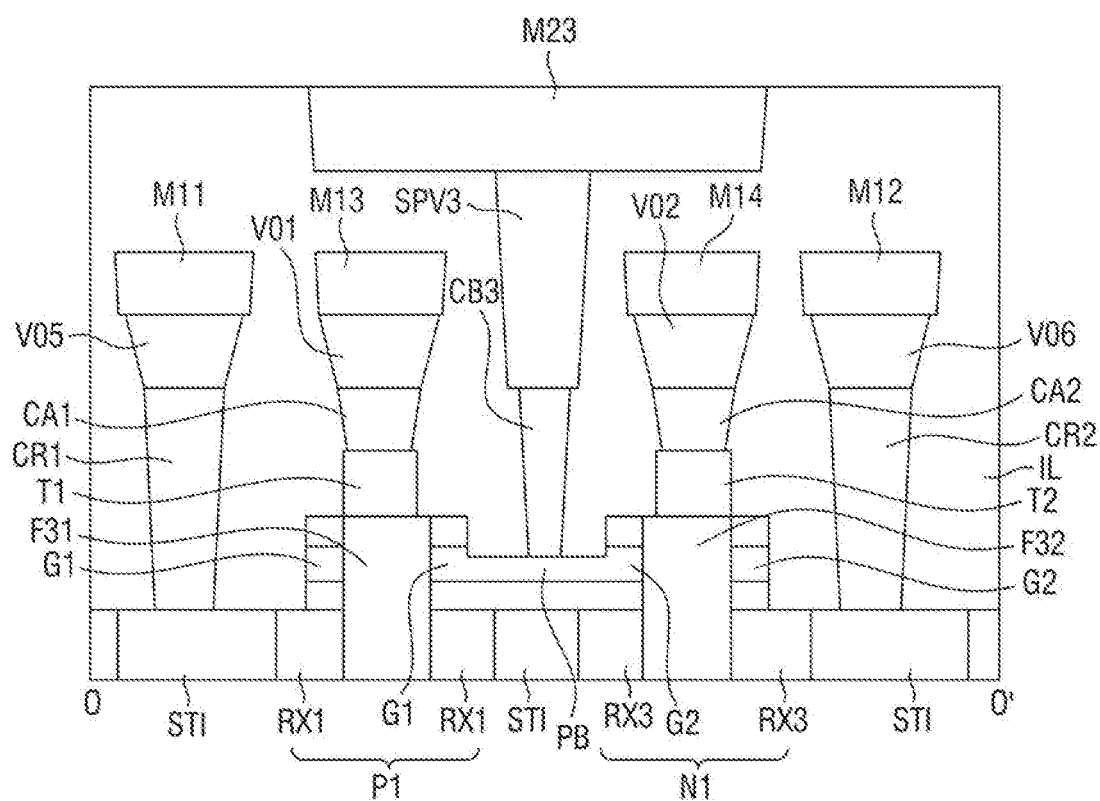
Figure 8C:
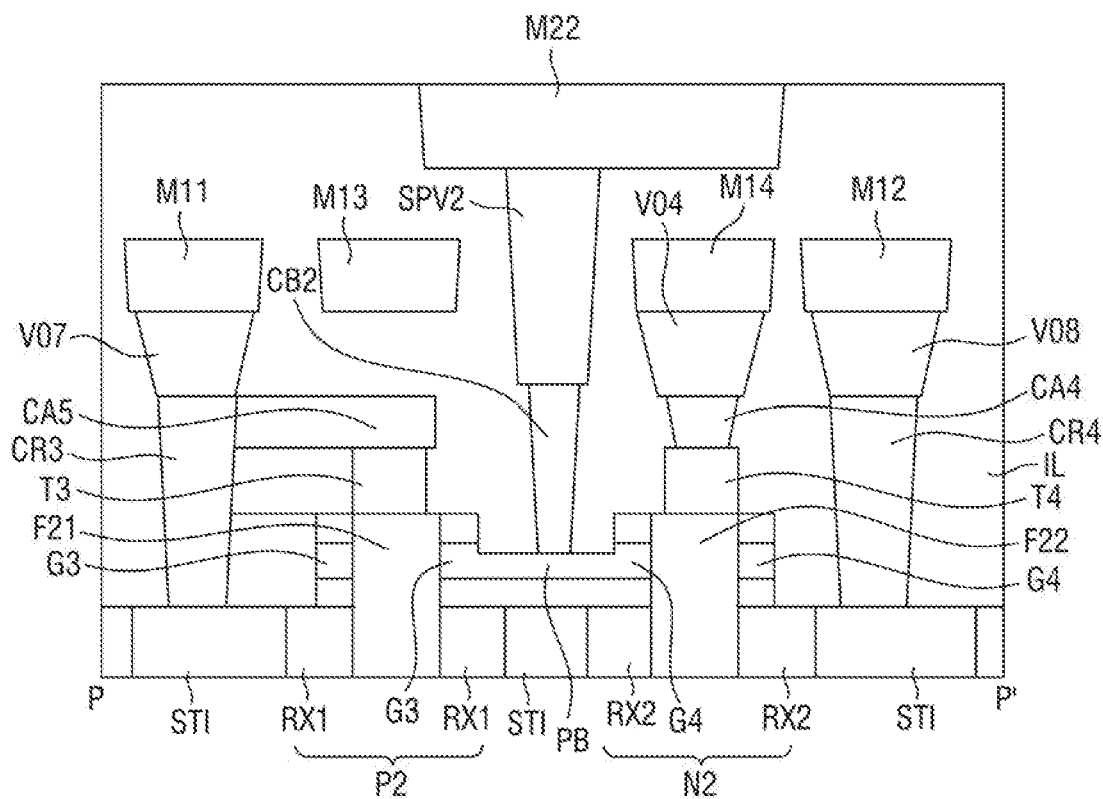
Figure 8D:
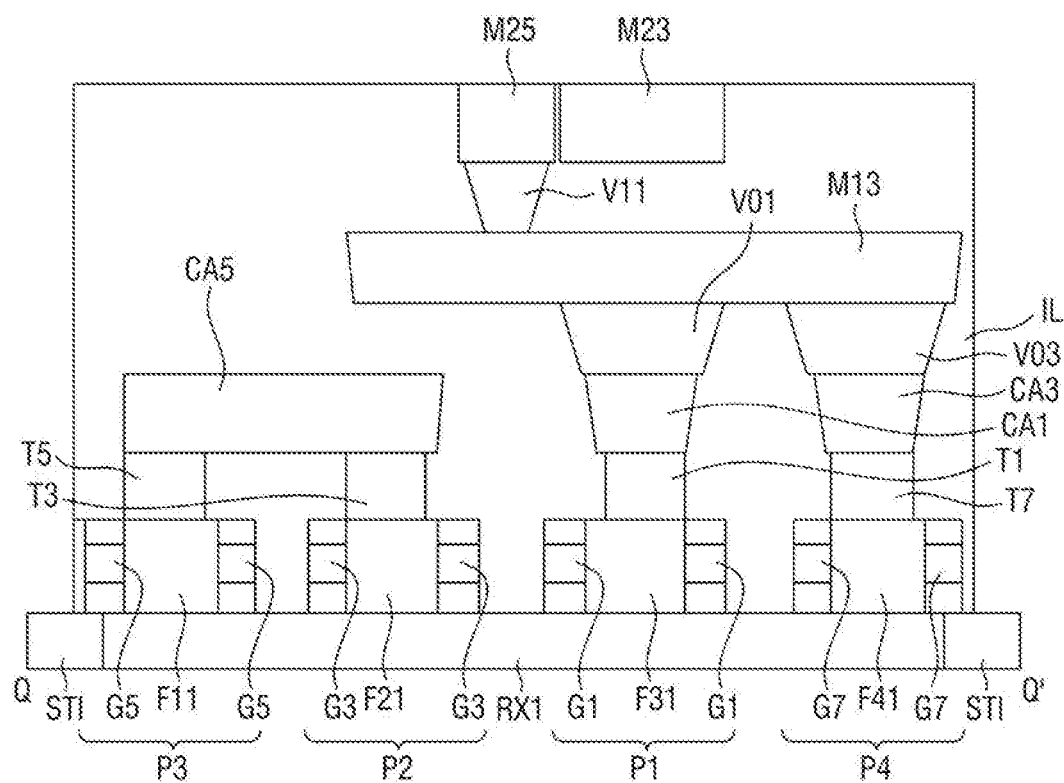
Figure 8E:
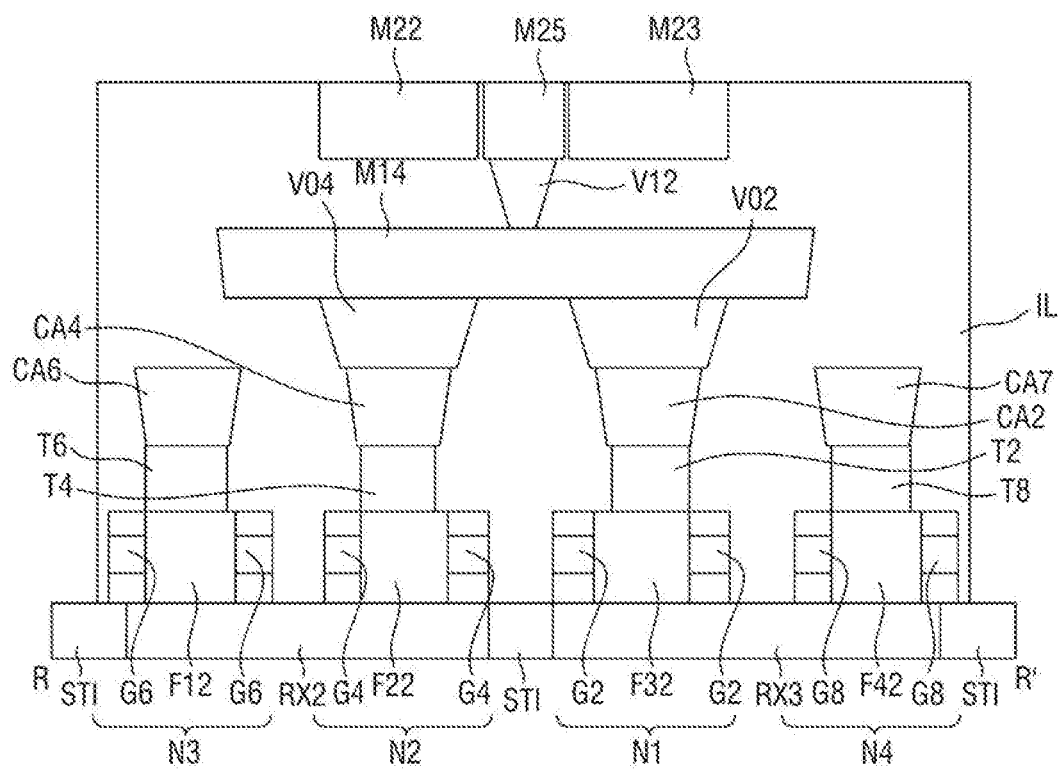
Figure 8F:
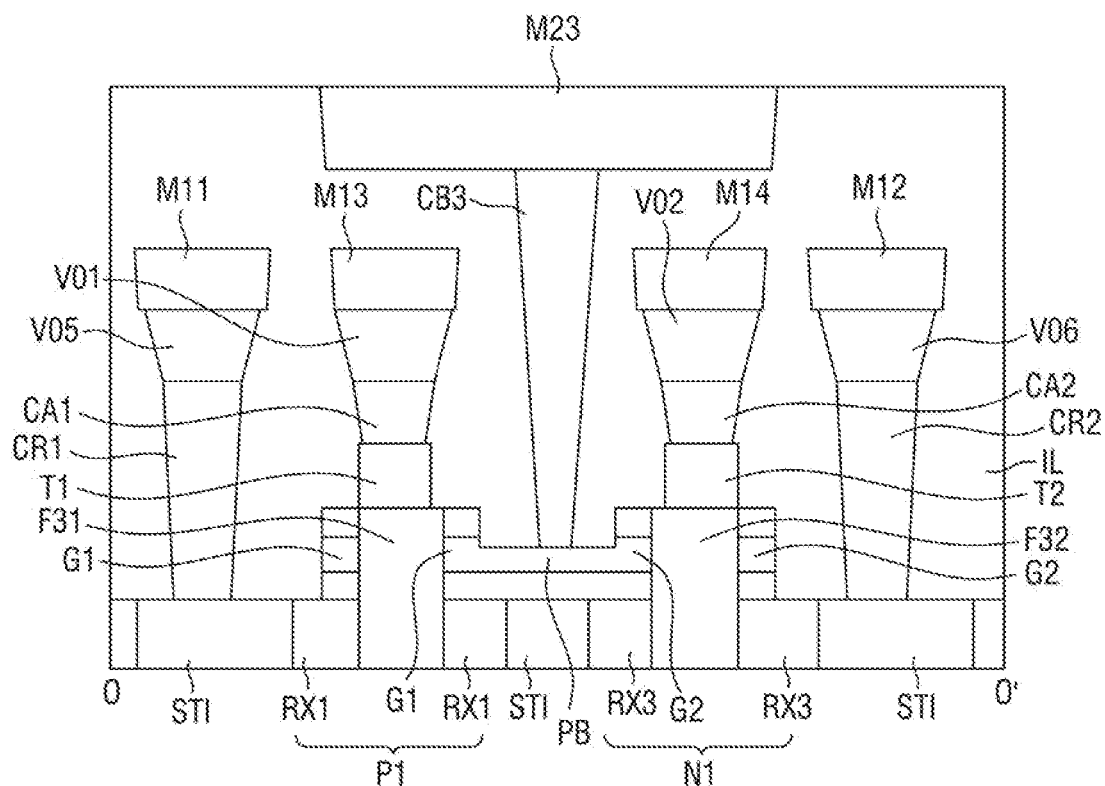

According to another embodiment, the cell architecture may dispense with the super vias SPV1 to SPV4 by providing heightened gate contact structures CB1 to CB4. For example, FIG. 8F illustrates an alternative structure of FIG. 8B in which SPV3 and the gate contact structure CB3 of FIG. 8B are replaced by the heightened gate contact structure CB3. By using these heightened gate contact structures CB1 to CB4, a manufacturing process of the logic circuits may be simplified.

Compared to the cell architecture for one-fin AOI22 circuit described above in reference with FIGS. 7A-7C, the cell architecture for the same one-fin AOI22 circuit according to the present embodiment is characterized in that the same metal pattern M25 for transmitting out the output signal $V_{out}$ of the logic circuit is disposed between two adjacent fin structures F2 and F3, whereby a gear ratio of 2:1 is achieved. That is, in the cell architecture of the present embodiment, the ratio of grid cell gate pitch (CPP) to metal pattern pitch (MP) is 2:1. By this structure, the cell architecture of the present embodiment can satisfy the minimum grid CPP requirement for AOI22 as well as achieving a more reduced size of a cell architecture.

Figure 9:
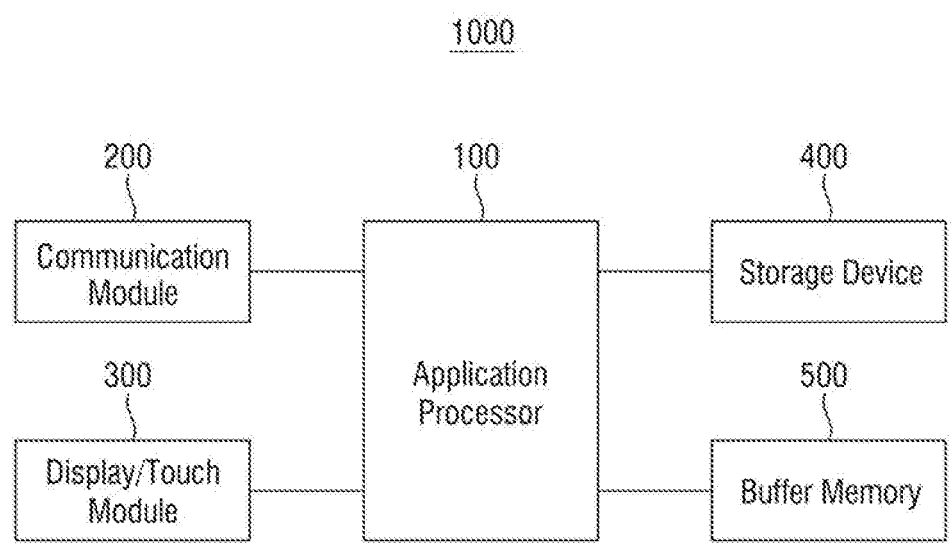
FIG. 9 illustrates a mobile device to which cell architectures of the above embodiments are applied.

Referring to FIG. 9, a mobile device 1000 may include at least one application processor 100, a communication module 200, a display/touch module 300, a storage device 400, and a buffer memory 500, where the cell architectures described above may apply.

The application processor 100 may control operations of the mobile device 1000. The communication module 200 is implemented to perform wireless or wire communications with an external device. The display/touch module 300 is implemented to display data processed by the application processor 100 and/or to receive data through a touch panel. The storage device 400 is implemented to store various data including user data. The storage device 400 may be an embedded multimedia card (eMMC), a solid state drive (SSD), a universal flash storage (UFS) device, etc. The storage device 400 may perform caching of the mapping data and the user data as described above.

The buffer memory 500 may temporarily store data used for processing operations of the mobile device 1000. For example, the buffer memory 500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the mobile device 1000 may include at least one standard cell having one of the cell architectures provided according to the above embodiments. The above embodiments may be applied to any electronic devices and systems. For example, these embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

According to the above embodiments, a cell height under 150 nm for a VFET cell architecture may be achieved compared to the cell height 180 nm-210 nm of the related art VFET cell architecture. In addition, due to the increase of the ratio of grid cell gate pitch (CPP) to metal pattern pitch (MP), about 5 to 10% of cell width reduction may be achieved.

The foregoing is illustrative of example embodiments and is not to be construed as limiting thereof. Although a few embodiments have been described, those skilled in the art will readily appreciate that many modifications are possible in the above embodiments without materially departing from the inventive concept.

What is claimed is:
1. A cell architecture comprising:
   a plurality of vertical field-effect transistors (VFETs) formed on a substrate to constitute a logic circuit;
   a $1^{st}$ top source/drain (S/D) contact structure formed on a $1^{st}$ top S/D region of a $1^{st}$ VFET and connected to a $1^{st}$ horizontal metal pattern formed thereon and extended in an X-direction of the cell architecture to connect an output signal of the logic circuit output from the $1^{st}$ top S/D region to a $1^{st}$ vertical metal pattern;

a $2^{nd}$ top S/D contact structure formed on a $2^{nd}$ top S/D region of a $2^{nd}$ VFET and connected to a $2^{nd}$ horizontal metal pattern formed thereon and extended in the X-direction to connect the output signal of the logic circuit output from the $2^{nd}$ top S/D region to the $1^{st}$ vertical metal pattern; and a gate contact structure formed on a gate connection pattern connected to respective gates of the $1^{st}$ and $2^{nd}$ VFETs, the gate contact structure being connected to an input signal of the logic circuit through a super via, wherein the $1^{st}$ VFET and the $2^{nd}$ VFET are formed along a $1^{st}$ fin structure extended in a Y-direction of the cell architecture, and wherein both of the $1^{st}$ top S/D contact structure and the $2^{nd}$ top S/D contact structure have a substantially-square shape in a plan view of the cell architecture.

2. The cell architecture of claim 1, wherein the super via is connected to a $2^{nd}$ vertical metal pattern to which the input signal of the logic circuit is input, and wherein the $1^{st}$ horizontal metal pattern and the $2^{nd}$ horizontal metal pattern are connected to the $1^{st}$ vertical metal pattern through a $1^{st}$ via and a $2^{nd}$ via, respectively.

3. The cell architecture of claim 2, wherein the $1^{st}$ vertical metal pattern and the $2^{nd}$ vertical metal pattern are parallel to each other without overlapping each other in the plan view of the cell architecture, and are disposed on a same level from an upper surface of the substrate.

4. The cell architecture of claim 3, wherein upper surfaces of the $1^{st}$ top S/D contact structure, the $2^{nd}$ top S/D contact structure and the gate contact structure are disposed on a same level from the upper surface of the substrate.

5. The cell architecture of claim 4, wherein a height of the super via is the same as a sum of heights of the $1^{st}$ via and the $1^{st}$ horizontal metal pattern.

6. The cell architecture of claim 4, wherein the $1^{st}$ top S/D contact structure is connected to the $1^{st}$ horizontal metal pattern through a $3^{rd}$ via formed thereon, and the $2^{nd}$ top S/D contact structure is connected to the $2^{nd}$ horizontal metal pattern through a $4^{th}$ via formed thereon.

7. The cell architecture of claim 6, wherein a height of the super via is the same as a sum of heights of the $1^{st}$ via, the $1^{st}$ horizontal metal pattern and the $3^{rd}$ via.

8. The cell architecture of claim 1, further comprising a $3^{rd}$ top S/D contact structure formed on a $3^{rd}$ top S/D region of a $3^{rd}$ VFET and extended to an edge of the cell architecture to be connected to a power rail, wherein an upper surface of the $3^{rd}$ top S/D contact structure is spaced apart from a lower surface of the $1^{st}$ horizontal metal pattern.

9. The cell architecture of claim 8, further comprising a $4^{th}$ top S/D contact structure formed on a $4^{th}$ top S/D region of a $4^{th}$ VFET and connected to the $2^{nd}$ horizontal metal pattern formed thereon and extended in the X-direction to connect the output signal of the logic circuit to the $1^{st}$ vertical metal pattern through a $2^{nd}$ via.

10. The cell architecture of claim 9, wherein the $3^{rd}$ VFET and the $4^{th}$ VFET are formed on a $2^{nd}$ fin structure extended in parallel with the $1^{st}$ fin structure, wherein the $1^{st}$ vertical metal pattern, through which the output signal of the logic circuit is transmitted out, is formed between the $1^{st}$ fin structure and the $2^{nd}$ fin structure.

* * * * *